United States Patent
Kitayama et al.

(10) Patent No.: US 7,893,774 B2
(45) Date of Patent: Feb. 22, 2011

(54) VCO DRIVING CIRCUIT AND FREQUENCY SYNTHESIZER

(75) Inventors: Yasuo Kitayama, Chitose (JP); Hiroki Kimura, Chitose (JP); Naoki Onishi, Chitose (JP); Nobuo Tsukamoto, Akishima (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/826,236

(22) Filed: Jun. 29, 2010

(65) Prior Publication Data

US 2010/0264962 A1  Oct. 21, 2010

Related U.S. Application Data

(60) Division of application No. 12/219,452, filed on Jul. 22, 2008, which is a continuation of application No. PCT/JP2007/051256, filed on Jan. 26, 2007.

(30) Foreign Application Priority Data

Jan. 26, 2006 (JP) ............................ P2006-017617
Jan. 30, 2006 (JP) ............................ P2006-021315

(51) Int. Cl.
*H03L 7/085* (2006.01)
*H03L 1/02* (2006.01)

(52) U.S. Cl. ............................ 331/17; 331/16; 331/176; 327/156

(58) Field of Classification Search .................... 331/16, 331/17, 34, 176; 327/147, 156; 375/376
See application file for complete search history.

(56) References Cited

U.S. PATENT DOCUMENTS 4,562,410 A * 12/1985 O'Rourke .................... 331/1 A
5,304,956 A * 4/1994 Egan ............................ 331/10
5,329,560 A * 7/1994 Rastegar et al. ............. 375/376
5,479,715 A * 1/1996 Schultheis et al. ....... 33/366.16

(Continued)

FOREIGN PATENT DOCUMENTS

JP  05-090993  4/1993

(Continued)

*Primary Examiner*—Robert Pascal
*Assistant Examiner*—Levi Gannon
(74) *Attorney, Agent, or Firm*—Jacobson Holman PLLC

(57) ABSTRACT

A VCO driving circuit and a frequency synthesizer wherein the impedance viewed from a VCO control terminal is reduced to prevent the VCO phase noise characteristic from degrading. A VCO driving circuit and a frequency synthesizer having the VCO driving circuit, which comprises a coarse adjustment DAC that receives a digital data, which has a coarse adjustment frequency, to output an analog signal; a fine adjustment DAC that receives a digital data, which has a fine adjustment frequency, to output an analog signal; a low response speed LPF5 that removes noise from the output signal from the coarse adjustment DAC and then provides the resultant signal as an input to a VCO control terminal; a high response speed LPF7 that converts the output signal from the fine adjustment DAC to a voltage, thereby smoothing the signal; a resistor that connects an input stage of the LPF5 to that of the LPF7; and a capacitor used for providing a capacitive coupling such that the output of the LPF7 is added to that of the LPF5.

4 Claims, 28 Drawing Sheets

U.S. PATENT DOCUMENTS

| | | | |
|---|---|---|---|
| 6,396,358 B1 * | 5/2002 | Poss et al. | 331/57 |
| 6,639,939 B1 * | 10/2003 | Naden et al. | 375/140 |
| 7,016,654 B1 * | 3/2006 | Bugeja | 455/73 |
| 7,429,895 B2 * | 9/2008 | Easwaran et al. | 331/16 |

FOREIGN PATENT DOCUMENTS

| | | |
|---|---|---|
| JP | 10-173521 | 6/1998 |
| JP | 11-185395 | 7/1999 |
| JP | 2004-274673 | 9/2004 |

* cited by examiner

FIG.15

| | FINE ADJUSTMENT DAC OUTPUT | VOLTAGE AT (2) | VCO FREQUENCY VARIATIONS | VF SENSITIVITY |
|---|---|---|---|---|
| [1] RESISTANCE OF LPF7=10Ω R4=10Ω | 0V | 0V | 6.0MHZ | 7.5MHZ |
| | 0.8V | 0.2V | | |
| [2] RESISTANCE OF LPF7=10Ω R4=5Ω | 0V | 0V | 3.3MHZ | 4.1MHZ |
| | 0.8V | 0.11V | | |

US 7,893,774 B2

VCO DRIVING CIRCUIT AND FREQUENCY SYNTHESIZER

This is a Divisional application of application Ser. No. 12/219,452, filed Jul. 22, 2008, which in turn is a continuation application of PCT/JP2007/051256, filed Jan. 26, 2007 and published in Japanese, claiming the priority benefit of Japanese Application No. 2006-17617, filed Jan. 26, 2006 and Japanese Patent Application No. 2006-21315, filed Jan. 30, 2006.

BACKGROUND OF THE INVENTION

1. Field of the Invention

The present invention generally relates to a circuit for driving a VCO (voltage controlled oscillator) of a frequency synthesizer. More particularly, the present invention relates to a VCO driving circuit and a frequency synthesizer using the same, in which the impedance as viewed from a VCO control terminal is reduced to prevent degradation of the VCO phase noise characteristics.

2. Description of the Related Art

A frequency synthesizer using a PLL (phase locked loop) is known as one of the standard signal generators.

[Conventional Frequency Synthesizer: FIG. 26]

A conventional frequency synthesizer will be described with reference to FIG. 26. FIG. 26 shows a schematic configuration diagram of the conventional frequency synthesizer.

As shown in FIG. 26, the conventional frequency synthesizer basically includes an oscillator 21 that oscillates at a reference frequency signal fref, a frequency divider 22 that divides the frequency signal to 1/M, a phase comparator (PLL IC) 23 that compares a phase of a reference signal from the frequency divider 22 with a phase of an output signal from a frequency divider 27 to thereby output a phase difference signal, a charge pump 24 that outputs the phase difference as a pulse width voltage, an LPF (low pass filter) 25 that smoothes out the output voltage from the charge pump 24, a VCO 26 that changes a frequency based on a control voltage from the LPF 25 to thereby oscillate a desired frequency, and the frequency divider 27 that branches out and receives the output frequency from the VCO 26 to thereby divide the output frequency to 1/N and outputs the divided frequency to the phase comparator 23.

The phase comparator 23 is implemented in the form of a PLL IC. Moreover, the frequency dividers 22 and 27 are usually in the form of a counter.

Moreover, the LPF 25 is generally in the form of a lag filter shown in FIG. 27 or a lead-lag filter shown in FIG. 28. FIG. 27 shows a configuration diagram of a lag filter, and FIG. 28 shows a configuration diagram of a lead-lag filter.

As shown in FIG. 27, the lag filter is a filter composed of a resistor R and a capacitor C.

As shown in FIG. 28, the lead-lag filter is a filter composed of two resistors R1 and R2 and one capacitor C.

The frequency synthesizer of FIG. 26 is a PLL oscillator that performs a feedback control by the phase comparator 23 detecting a phase difference so that the phase of the VCO 26 is maintained at a constant value relative to the phase of a reference signal.

Usually, a plurality of such configurations is arranged in an apparatus.

An example of the prior art of such a frequency synthesizer is disclosed in Japanese Unexamined Patent Publication (Kokai) No. 2004-274673 (Patent Document 1).

[Another Frequency Synthesizer: FIG. 29]

Another conventional frequency synthesizer will be described with reference to FIG. 29. FIG. 29 shows a schematic configuration diagram of another conventional frequency synthesizer.

The frequency synthesizer shown in FIG. 29 basically includes an oscillator 21 that oscillates at a reference frequency signal fref, a frequency divider 22 that divides the frequency signal to 1/M, a phase comparator (PLL IC) 23 that compares a phase of a reference signal from the frequency divider 22 with a phase of an output signal from a frequency divider 27 to thereby output a phase difference signal, a charge pump 24 that outputs the phase difference as a pulse width voltage, an LPF (low pass filter) 25 that smoothes out the output voltage from the charge pump 24, a VCO 26 that changes a frequency based on a control voltage from the LPF 25 to thereby oscillate a desired frequency, the frequency divider 27 that receives and branches off the output frequency from the VCO 26 to thereby divide the output frequency to 1/N and outputs the divided frequency to the phase comparator 23, a CPU (central processing unit) 28 that gives data setting timings to the frequency divider 27 and outputs a data value of a preset voltage corresponding to a setting frequency, a D/A converter (DAC) 29 that A/D converts the data value of the preset voltage from the CPU 28, and an adder 30 that adds the preset voltage from the DAC 29 to the output from the LPF 25.

The preset voltage corresponding to the setting frequency is added by the adder 30 at the rear stage of the LPF 25. Therefore, the output voltage of the LPF 25 is locked by the PLL circuit with small voltage fluctuation required for error correction, and thus the lock time can be shortened.

According to another example of the prior art, Japanese Unexamined Patent Publication (Kokai) No. 05-090993 (Patent Document 2) discloses a PLL frequency synthesizer having two loop filters which are alternately switched upon high speed switching of an output high-frequency signal.

According to another example of the prior art, Japanese Unexamined Patent Publication (Kokai) No. 10-173521 (Patent Document 3) discloses a PLL circuit that uses a normal VCO to reduce externally attached components and to allow performing a pull-in operation even when an oscillation frequency of the VCO is deviated due to fluctuation in manufacturing. The PLL circuit includes a multiplexer that is inserted between a phase comparator and a loop filter, a PWM signal generator that generates a PWM-L signal having a low duty factor and a PWM-H signal having a high duty factor based on a reference clock, and a frequency determining circuit that determines as to whether or not the frequency of a dividing signal is within a predetermined frequency range based on the reference clock and that transmits a switching signal according to the result of the determination to the multiplexer. When the frequency of the dividing signal is within the predetermined range, the output of the phase comparator is supplied to the loop filter, while when it is higher than the predetermined range, the PWM-L signal is supplied to the loop filter, and when it is lower than the predetermined range, the PWM-H signal is supplied to the loop filter.

According to another example of the prior art, Japanese Unexamined Patent Publication (Kokai) No. 11-185395 (Patent Document 4) discloses a clock reproduction PLL unit that prevents PLL unlock due to temperature variation and generates a reference voltage with high accuracy with a resolution finer than a phase difference signal. In the PLL unit, an 8-bit phase difference signal is input from a phase comparator to one input of a differential amplifier, while reference data having a resolution of 12 bits having been modulated in a time base direction in a data modulation circuit are input to the other input of the phase comparator, whereby a control voltage is generated based on a reference voltage substantially having a resolution of 12 bits.

Patent Document 1: Japanese Unexamined Patent Publication (Kokai) No. 2004-274673

Patent Document 1: Japanese Unexamined Patent Publication (Kokai) No. 05-090993

Patent Document 1: Japanese Unexamined Patent Publication (Kokai) No. 10-173521

Patent Document 1: Japanese Unexamined Patent Publication (Kokai) No. 11-185395

However, in the conventional frequency synthesizers described above, when driving circuits such as the charge pump 24, the LPF 25, and the like, connected to the control terminal of the VCO 26 has a high impedance, the phase noise characteristics of the VCO 26 is degraded at an offset frequency of several kHz or less. Therefore, there is a problem that the VCO 26 driven with high impedance may be unable to suppress the noise even when the PLL is successfully locked.

In such a case, since the high impedance is in the order of several hundreds of ohms [Ω], a normal lag-lead filter cannot cope with such a problem.

SUMMARY OF THE INVENTION

The present invention has been made in consideration of the aforementioned situation, and it is an object of the invention to provide a VCO driving circuit and a frequency synthesizer, in which the impedance as viewed from a VCO control terminal is reduced to prevent degradation of the VCO phase noise characteristics.

Another object of the invention is to provide a VCO driving circuit and a frequency synthesizer, in which the impedance as viewed from a VCO control terminal is reduced to prevent degradation of the VCO phase noise characteristics, and in which a natural frequency is maintained at a constant value against solid variations of the VCO or temperature variations.

To overcome the problems of the conventional techniques, according to an aspect of the present invention, there is provided a VCO driving circuit that inputs a control signal to a control terminal of a voltage controlled oscillator, the VCO driving circuit including: a coarse adjustment DAC that receives digital data having a coarse adjustment frequency to output an analog signal; a fine adjustment DAC that receives digital data having a fine adjustment frequency to output an analog signal; a first LPF that removes noise from an output signal from the coarse adjustment DAC and then provides the resultant signal as an input to the control terminal of the voltage controlled oscillator, the first LPF having frequency pass characteristics that allow only a low frequency component to pass therethrough; a second LPF that converts an output signal from the fine adjustment DAC to a voltage to thereby smooth the signal, the second LPF having frequency pass characteristics that allow high frequency components to pass therethrough; a resistor that connects an input stage of the first LPF to an input stage of the second LPF; and a capacitor that provides a capacitive coupling such that the output of the second LPF is added to the output of the first LPF. It is, therefore, possible to provide an advantage that the impedance as viewed from the control terminal of the voltage controlled oscillator is reduced to prevent degradation of the phase noise characteristics of the voltage controlled oscillator.

In the VCO driving circuit according to the above aspect of the present invention, the first LPF is configured by a combination of a resistor and a capacitor. Moreover, a combination of an inductor and a capacitor or a resistor, or a combination of an inductor and a capacitor, the second LPF is configured by a combination of a resistor and a capacitor, a combination of an inductor and a capacitor or a resistor, or a combination of an inductor and a capacitor. Furthermore, a resistance of the resistor connecting the input stage of the first LPF to the input stage of the second LPF is larger than a total resistance of the resistors of the second LPF. It is, therefore, possible to provide an advantage that the voltage controlled oscillator is not influenced by a DC component of the voltage of the fine adjustment DAC.

According to another aspect of the present invention, there is provided a VCO driving circuit that inputs a control signal to a control terminal of a voltage controlled oscillator, the VCO driving circuit including: a coarse adjustment DAC that receives digital data having a coarse adjustment frequency to output an analog signal; a fine adjustment DAC that receives digital data having a fine adjustment frequency to output an analog signal; a first LPF that removes noise from an output signal from the coarse adjustment DAC, the first LPF having frequency pass characteristics that allow only a low frequency component to pass therethrough; a voltage dividing means that divides a voltage of an output from the fine adjustment DAC; a resistor that connects an input stage of the first LPF to an input stage of the voltage dividing means; a third LPF that smoothes out an output signal from the first LPF and then provides the resulting signal as an input to the control terminal of the voltage controlled oscillator; and a capacitor that provides a capacitive coupling such that the voltage divided by the voltage dividing means is applied to the output of the first LPF. It is, therefore, possible to provide an advantage that the impedance as viewed from the control terminal of the voltage controlled oscillator is reduced to prevent degradation of the phase noise characteristics of the voltage controlled oscillator.

In the VCO driving circuit according to the above aspect of the present invention, the first LPF is configured by a combination of a resistor and a capacitor, a combination of an inductor and a capacitor or a resistor, or a combination of an inductor and a capacitor. Moreover, the third LPF is configured by a combination of a resistor and a capacitor, a combination of an inductor and a capacitor or a resistor, or a combination of an inductor and a capacitor. Furthermore, the voltage dividing means is configured by a plurality of resistors, and a resistance of the resistor connecting the input stage of the first LPF to the input stage of the voltage dividing means is larger than a total resistance of the resistors of the voltage dividing means. It is, therefore, possible to provide an advantage that the voltage controlled oscillator is not influenced by a DC component of the voltage of the fine adjustment DAC.

In the VCO driving circuit according to the above aspect of the present invention, the VCO driving circuit further includes a switch that connects or disconnects the input stage of the first LPF to or from an output stage thereof, and the switch is temporarily turned on during power-on or frequency tuning to realize the connection, thereby performing charging and discharging of the capacitor that provides the capacitive coupling. It is, therefore, possible to provide an advantage that the capacitor providing the capacitive coupling is instantaneously charged or discharged during power-on or frequency tuning and thus the lock time is shortened.

In the VCO driving circuit according to the above aspect of the present invention, the switch is turned off after a predetermined period to realize the disconnection, thereby returning to a mode wherein a normal PLL control operation is performed. It is, therefore, possible to provide an advantage that a normal driving control can be realized in a quick manner.

According to another aspect of the present invention, there is provided a frequency synthesizer, including: the VCO driving circuit according to the above aspect, having the control circuit that outputs digital data having a coarse adjustment frequency and digital data having a fine adjustment frequency; a voltage controlled oscillator that oscillates at a desired frequency; a reference frequency oscillation circuit that oscillates at a reference frequency; a first frequency divider that divides the oscillated reference frequency to 1/M; and a second frequency divider that receives an output of the voltage controlled oscillator as a feed back input and divides the output to 1/N, wherein the control circuit of the VCO driving circuit receives and compares a signal from the first frequency divider and a signal from the second frequency divider with each other to thereby output the digital data having the coarse adjustment frequency and the digital data having the fine adjustment frequency based on a difference between both signals. It is, therefore, possible to provide an advantage that the impedance as viewed from the control terminal of the voltage controlled oscillator is reduced to prevent degradation of the phase noise characteristics of the voltage controlled oscillator.

According to another aspect of the present invention, there is provided a VCO driving circuit that inputs a control signal to a control terminal of a voltage controlled oscillator, the VCO driving circuit including: a control circuit that outputs digital data having a coarse adjustment frequency and digital data having a fine adjustment frequency; a coarse adjustment DAC that receives the digital data having the coarse adjustment frequency to output an analog signal; a fine adjustment DAC that receives the digital data having the fine adjustment frequency to output an analog signal; a first LPF that removes noise from an output signal from the coarse adjustment DAC and then provides the resultant signal as an input to the control terminal of the voltage controlled oscillator, the first LPF having frequency pass characteristics that allow only a low frequency component to pass therethrough; a second LPF that converts an output signal from the fine adjustment DAC to a voltage to thereby smooth the signal, the second LPF having frequency pass characteristics that allow high frequency components to pass therethrough; a resistor that connects an input stage of the first LPF to an input stage of the second LPF; a capacitor that provides a capacitive coupling such that the output of the second LPF is added to the output of the first LPF; and a voltage control means that is provided to the second LPF so as to vary the voltage. It is, therefore, possible to provide an advantage that the impedance as viewed from the control terminal of the voltage controlled oscillator is reduced to prevent degradation of the phase noise characteristics of the voltage controlled oscillator, and that a natural frequency is maintained at a constant value against solid variations of the VCO or temperature variations.

In the VCO driving circuit according to the above aspect of the present invention, the first LPF is configured by a combination of a resistor and a capacitor, a combination of an inductor and a capacitor or a resistor, or a combination of an inductor and a capacitor. Moreover, the second LPF is configured by a combination of a resistor and a capacitor, a combination of an inductor and a capacitor or a resistor, or a combination of an inductor and a capacitor. Furthermore, a resistance of the resistor connecting the input stage of the first LPF to the input stage of the second LPF is larger than a total resistance of the resistors of the second LPF, and the voltage control means is configured by a variable resistor. It is, therefore, possible to provide an advantage that the voltage controlled oscillator is not influenced by a DC component of the voltage of the fine adjustment DAC.

According to another aspect of the present invention, there is provided a VCO driving circuit that inputs a control signal to a control terminal of a voltage controlled oscillator, the VCO driving circuit including: a control circuit that outputs digital data having a coarse adjustment frequency and digital data having a fine adjustment frequency; a coarse adjustment DAC that receives the digital data having the coarse adjustment frequency to output an analog signal; a fine adjustment DAC that receives the digital data having the fine adjustment frequency to output an analog signal; a first LPF that removes noise from an output signal from the coarse adjustment DAC, the first LPF having frequency pass characteristics that allow only a low frequency component to pass therethrough; a voltage dividing means that divides a voltage of an output from the fine adjustment DAC; a resistor that connects an input stage of the first LPF to an input stage of the voltage dividing means; a third LPF that smoothes out an output signal from the first LPF and then provides the resulting signal as an input to the control terminal of the voltage controlled oscillator; a capacitor that provides a capacitive coupling such that the voltage divided by the voltage dividing means is applied to the output of the first LPF; and a voltage control means that is provided to the voltage dividing means so as to vary the voltage. It is, therefore, possible to provide an advantage that the impedance as viewed from the control terminal of the voltage controlled oscillator is reduced to prevent degradation of the phase noise characteristics of the voltage controlled oscillator, and that a natural frequency is maintained at a constant value against solid variations of the VCO or temperature variations.

In the VCO driving circuit according to the above aspect of the present invention, the first LPF is configured by a combination of a resistor and a capacitor, a combination of an inductor and a capacitor or a resistor, or a combination of an inductor and a capacitor. Moreover, the third LPF is configured by a combination of a resistor and a capacitor, a combination of an inductor and a capacitor or a resistor, or a combination of an inductor and a capacitor. Furthermore, the voltage dividing means is configured by a combination of a resistor and a variable resistor, and a resistance of the resistor connecting the input stage of the first LPF to the input stage of the voltage dividing means is larger than a total resistance of the resistors of the voltage dividing means. It is, therefore, possible to provide an advantage that the voltage controlled oscillator is not influenced by a DC component of the voltage of the fine adjustment DAC.

In the VCO driving circuit according to the above aspect of the present invention, the control circuit stores therein a control value of the voltage control means of the VCO driving circuit and supplies the control value to the voltage control means, the control value being capable of maintaining a natural frequency at a constant value against solid variations of the voltage controlled oscillator. Moreover, the VCO driving circuit further includes a temperature measurement means that measures temperature around the voltage controlled oscillator. The control circuit stores therein a control value of the voltage control means of the VCO driving circuit and supplies the control value to the voltage control means in accordance with a value of the temperature input from the temperature measurement means, the control value being capable of maintaining a natural frequency at a constant value against temperature variations of the voltage controlled oscillator. It is, therefore, possible to provide an advantage that the impedance as viewed from the control terminal of the voltage controlled oscillator is reduced to prevent degradation of the phase noise characteristics of the voltage controlled oscillator, and that a natural frequency can be maintained at a constant value without difficulties against solid variations of the VCO or temperature variations.

In the VCO driving circuit according to the above aspect of the present invention, the VCO driving circuit further includes a switch that connects or disconnects the input stage of the first LPF to or from an output stage thereof, and the switch is temporarily turned on during power-on or frequency tuning to realize the connection, thereby performing charging and discharging of the capacitor that provides the capacitive coupling. It is, therefore, possible to provide an advantage that the capacitor providing the capacitive coupling is instantaneously charged or discharged during power-on or frequency tuning and thus the lock time is shortened.

In the VCO driving circuit according to the above aspect of the present invention, the switch is turned off after a predetermined period to realize the disconnection, thereby performing discharging of the charged capacitor. It is, therefore, possible to provide an advantage that a normal driving control can be realized in a quick manner.

According to another aspect of the present invention, there is provided a frequency synthesizer, including: a voltage controlled oscillator that oscillates at a desired frequency; a reference frequency oscillation circuit that oscillates at a reference frequency; a first frequency divider that divides the oscillated reference frequency to 1/M; a second frequency divider that receives an output of the voltage controlled oscillator as a feed back input and divides the output to 1/N; and the VCO driving circuit according to the above aspect, in which a control circuit of the VCO driving circuit receives and compares a signal from the first frequency divider and a signal from the second frequency divider with each other to thereby output the digital data having the coarse adjustment frequency and the digital data having the fine adjustment frequency based on a difference between both signals. It is, therefore, possible to provide an advantage that the impedance as viewed from the control terminal of the voltage controlled oscillator is reduced to prevent degradation of the phase noise characteristics of the voltage controlled oscillator, and that a natural frequency is maintained at a constant value against solid variations of the VCO or temperature variations.

BRIEF DESCRIPTION OF THE DRAWINGS

FIG. 15 is a diagram illustrating the relationship between a variable resistor R4 and VF sensitivity.

DESCRIPTION OF REFERENCE NUMERALS

Figure 1:
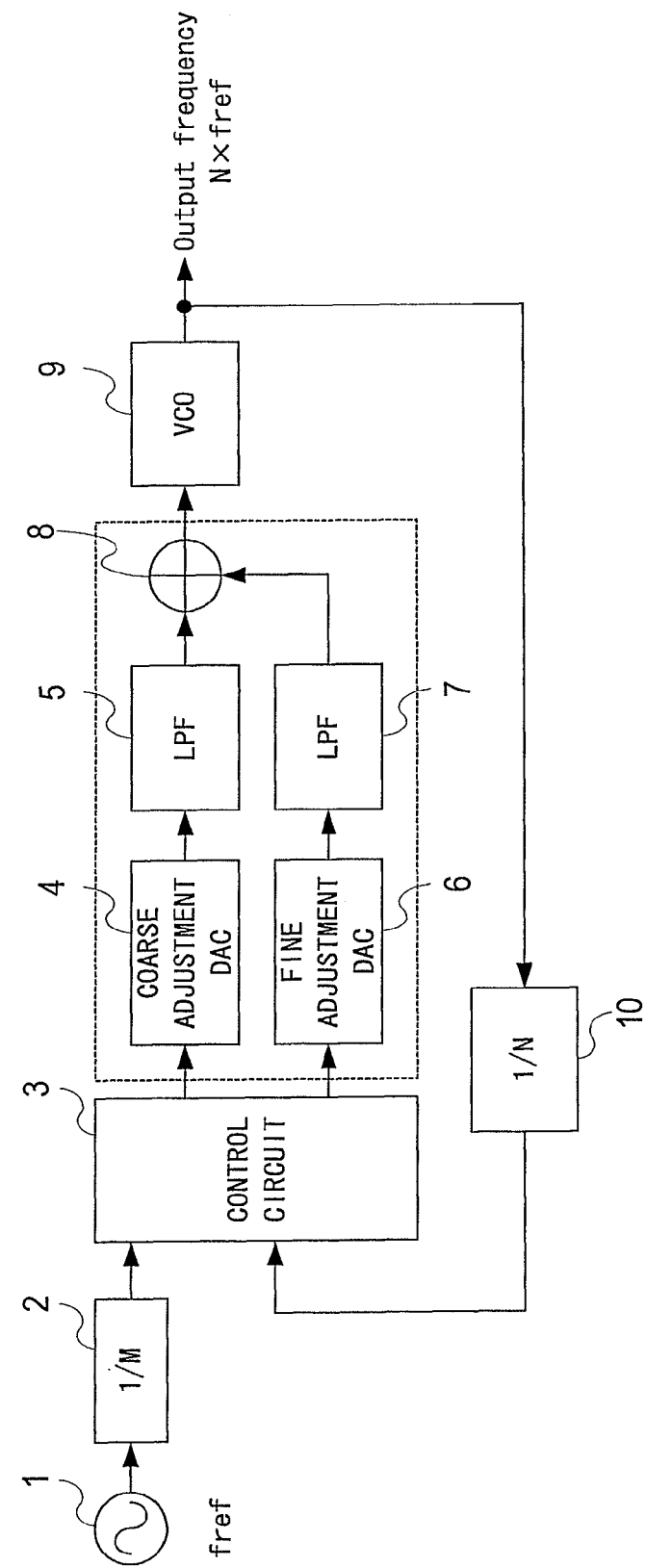
FIG. 1 is a schematic configuration diagram of a frequency synthesizer according to an embodiment of the present invention.

1 . . . OSCILLATION CIRCUIT, 2 . . . FREQUENCY DIVIDER, 3 . . . CONTROL CIRCUIT, 4 . . . COARSE ADJUSTMENT DAC, 5 . . . LPF, 6 . . . FINE ADJUSTMENT DAC, 7 . . . PF, 8 . . . MIXER, 9 . . . VOLTAGE-CONTROLLED OSCILLATOR (VCO), 10 . . . FREQUENCY DIVIDER, 11 . . . OPERATIONAL AMPLIFIER, 12 . . . PULSE-WIDTH MODULATION CIRCUIT (PWM), 13 . . . SWITCH, 14 . . . TEMPERATURE SENSOR, 15 . . . LPF, 21 . . . OSCILLATOR, 22 . . . FREQUENCY DIVIDER, 23 . . . PHASE COMPARATOR (PLL IC), 24 . . . CHARGE PUMP, 25 . . . LPF, 26 . . . VCO, 27 . . . FREQUENCY DIVIDER, 28 . . . CPU, 29 . . . DAC, 30 . . . ADDER

DETAILED DESCRIPTION OF THE PREFERRED EMBODIMENT

An embodiment of the present invention will be described with reference to the accompanying drawings.

Outline of Embodiment

A VCO driving circuit according to an embodiment of the present invention is a VCO driving circuit that inputs a control signal to a control terminal of a voltage controlled oscillator, the VCO driving circuit including: a coarse adjustment DAC that receives digital data having a coarse adjustment frequency to output an analog signal; a fine adjustment DAC that receives digital data having a fine adjustment frequency to output an analog signal; a first LPF (an LPF having a large time constant) that removes noise from an output signal from the coarse adjustment DAC and then provides the resultant signal as an input to the control terminal of the voltage controlled oscillator, the first LPF having frequency pass characteristics (having a low response speed) that allow only a low frequency component to pass therethrough; a second LPF (an LPF having a small time constant) that converts an output signal from the fine adjustment DAC to a voltage to thereby smooth the signal, the second LPF having frequency pass characteristics (having a high response speed) that allow high frequency components to pass therethrough; a resistor that connects an input stage of the first LPF to an input stage of the second LPF; and a capacitor that provides a capacitive coupling such that the output of the second LPF is added to the output of the first LPF. It is, therefore, possible to reduce the impedance as viewed from a VCO control terminal to thereby prevent degradation of the VCO phase noise characteristics.

A VCO driving circuit according to an embodiment of the present invention is a VCO driving circuit that inputs a control signal to a control terminal of a voltage controlled oscillator, the VCO driving circuit including: a coarse adjustment DAC that receives digital data having a coarse adjustment frequency to output an analog signal; a fine adjustment DAC that receives digital data having a fine adjustment frequency to output an analog signal; a first LPF (an LPF having a large time constant) that removes noise from an output signal from the coarse adjustment DAC, the first LPF having frequency pass characteristics (having a low response speed) that allow only a low frequency component to pass therethrough; a voltage dividing means that divides a voltage of an output from the fine adjustment DAC; a resistor that connects an input stage of the first LPF to an input stage of the voltage dividing means; a third LPF (a smoothing LPF) that smoothes out an output signal from the first LPF and then provides the resulting signal as an input to the control terminal of the voltage controlled oscillator; and a capacitor that provides a capacitive coupling such that the voltage divided by the voltage dividing means is applied to the output of the first LPF. It is, therefore, possible to reduce the impedance as viewed from a VCO control terminal to thereby prevent degradation of the VCO phase noise characteristics.

A frequency synthesizer according to an embodiment of the present invention includes a voltage controlled oscillator that oscillates at a desired frequency; a reference frequency oscillation circuit that oscillates at a reference frequency; a first frequency divider that divides the oscillated reference frequency to 1/M; a second frequency divider that receives an output of the voltage controlled oscillator as a feed back input and divides the output to 1/N; a control circuit that receives and compares a signal from the first frequency divider and a signal from the second frequency divider with each other to thereby output the digital data having the coarse adjustment frequency and the digital data having the fine adjustment frequency based on a difference between both signals; and the VCO driving circuit. It is, therefore, possible to reduce the impedance as viewed from a VCO control terminal to thereby prevent degradation of the VCO phase noise characteristics.

A VCO driving circuit according to an embodiment of the present invention is a VCO driving circuit that inputs a control signal to a control terminal of a voltage controlled oscillator, the VCO driving circuit including: a control circuit that outputs digital data having a coarse adjustment frequency and digital data having a fine adjustment frequency; a coarse adjustment DAC that receives the digital data having the coarse adjustment frequency to output an analog signal; a fine adjustment DAC that receives the digital data having the fine adjustment frequency to output an analog signal; a first LPF (an LPF having a large time constant) that removes noise from an output signal from the coarse adjustment DAC and then provides the resultant signal as an input to the control terminal of the voltage controlled oscillator, the first LPF having frequency pass characteristics (having a low response speed) that allow only a low frequency component to pass therethrough; a second LPF (an LPF having a small time constant) that converts an output signal from the fine adjustment DAC to a voltage to thereby smooth the signal, the second LPF having frequency pass characteristics (having a high response speed) that allow high frequency components to pass therethrough; a resistor that connects an input stage of the first LPF to an input stage of the second LPF; a capacitor that provides a capacitive coupling such that the output of the second LPF is added to the output of the first LPF; and a voltage control means that is provided to the second LPF so as to vary the voltage. It is, therefore, possible to reduce the impedance as viewed from a VCO control terminal to thereby prevent degradation of the VCO phase noise characteristics and to maintain a natural frequency at a constant value against solid variations of the VCO or temperature variations.

A VCO driving circuit according to an embodiment of the present invention is a VCO driving circuit that inputs a control signal to a control terminal of a voltage controlled oscillator, the VCO driving circuit including: a control circuit that outputs digital data having a coarse adjustment frequency and digital data having a fine adjustment frequency; a coarse adjustment DAC that receives the digital data having the coarse adjustment frequency to output an analog signal; a fine adjustment DAC that receives the digital data having the fine adjustment frequency to output an analog signal; a first LPF (an LPF having a large time constant) that removes noise from an output signal from the coarse adjustment DAC, the first LPF having frequency pass characteristics (having a low response speed) that allow only a low frequency component to pass therethrough; a voltage dividing means that divides a voltage of an output from the fine adjustment DAC; a resistor that connects an input stage of the first LPF to an input stage of the voltage dividing means; a third LPF (a smoothing LPF) that smoothes out an output signal from the first LPF and then provides the resulting signal as an input to the control terminal of the voltage controlled oscillator; a capacitor that provides a capacitive coupling such that the voltage divided by the voltage dividing means is applied to the output of the first LPF; and a voltage control means that is provided to the voltage dividing means so as to vary the voltage. It is, therefore, possible to reduce the impedance as viewed from a VCO control terminal to thereby prevent degradation of the VCO phase noise characteristics and to maintain a natural frequency at a constant value against solid variations of the VCO or temperature variations.

A frequency synthesizer according to an embodiment of the present invention includes a voltage controlled oscillator that oscillates at a desired frequency; a reference frequency oscillation circuit that oscillates at a reference frequency; a first frequency divider that divides the oscillated reference frequency to 1/M; a second frequency divider that receives an output of the voltage controlled oscillator as a feed back input and divides the output to 1/N; and the VCO driving circuit according to the above aspect, in which a control circuit of the VCO driving circuit receives and compares a signal from the first frequency divider and a signal from the second frequency divider with each other to thereby output the digital data having the coarse adjustment frequency and the digital data having the fine adjustment frequency based on a difference between both signals. It is, therefore, possible to reduce the impedance as viewed from a VCO control terminal to thereby prevent degradation of the VCO phase noise characteristics and to maintain a natural frequency at a constant value against solid variations of the VCO or temperature variations.

[Schematic Configuration of Frequency Synthesizer: FIG. 1]

A frequency synthesizer according to an embodiment of the present invention will be described with reference to FIG. 1. FIG. 1 shows a schematic configuration diagram of a frequency synthesizer according to an embodiment of the present invention.

The frequency synthesizer (present frequency synthesizer) according to the embodiment of the present invention, as shown in FIG. 1, includes: an oscillation circuit 1 that oscillates at a reference frequency fref; a frequency divider (first frequency divider) 2 that divides the reference frequency to 1/M; a control circuit 3 that compares a signal from the frequency divider 2 and a signal fed back from a VCO 9 to thereby output coarse adjustment data and fine adjustment data based on a difference between both signals; a coarse adjustment D/A converter (DAC) 4 that converts the coarse adjustment data from a digital signal to an analog signal; an LPF (first LPF) 5 that passes a low-frequency component of the signal from the coarse adjustment DAC 4; a fine adjustment D/A converter (DAC) 6 that converts the fine adjustment data from a digital signal to an analog signal; an LPF (second LPF) that passes a low-frequency component of the signal from the fine adjustment DAC 6; a mixer 8 that mixes the signals from both LPFs 5 and 7; a voltage controlled oscillator (VCO) 9 that oscillates based on a voltage of the signal from the mixer 8; and a frequency divider (second frequency divider) 10 that branches out and receives an output of the VCO 9, divides the output to 1/N, and output the divided output to the control circuit 3.

The control circuit 3 is configured by an FPGA (field programmable gate array), a DSP (digital signal processor), or an ASIC (application specific integrated circuit) and is operable to output data having a coarse adjustment frequency to the coarse adjustment DAC 4 while outputting data having a fine adjustment frequency to the fine adjustment DAC 6.

That is, the coarse adjustment frequency data are sampled in a coarse manner, while the fine adjustment frequency data are sampled in a fine manner, and a coarse adjustment voltage and a fine adjustment voltage are mixed with each other, whereby a control voltage of the VCO 9 is adjusted in a quick manner.

Here, the VCO driving circuit is configured by the control circuit 3, the coarse adjustment DAC 4, the LPF 5, the fine adjustment DAC 6, the LPF 7, and the mixer 8. The coarse adjustment DAC 4 outputs a coarse VCO output frequency (coarse adjustment frequency) voltage, and the fine adjustment DAC 6 outputs a fine adjustment frequency voltage. In the mixer 8, the coarse adjustment frequency voltage is mixed with the fine adjustment frequency voltage, whereby the coarse adjustment frequency voltage is adjusted with the fine adjustment frequency voltage and the adjusted voltage is input to the VCO 9.

That is, a whole PLL is configured by the fine adjustment DAC 6, the LPF 7, and the mixer 8.

Figure 2:
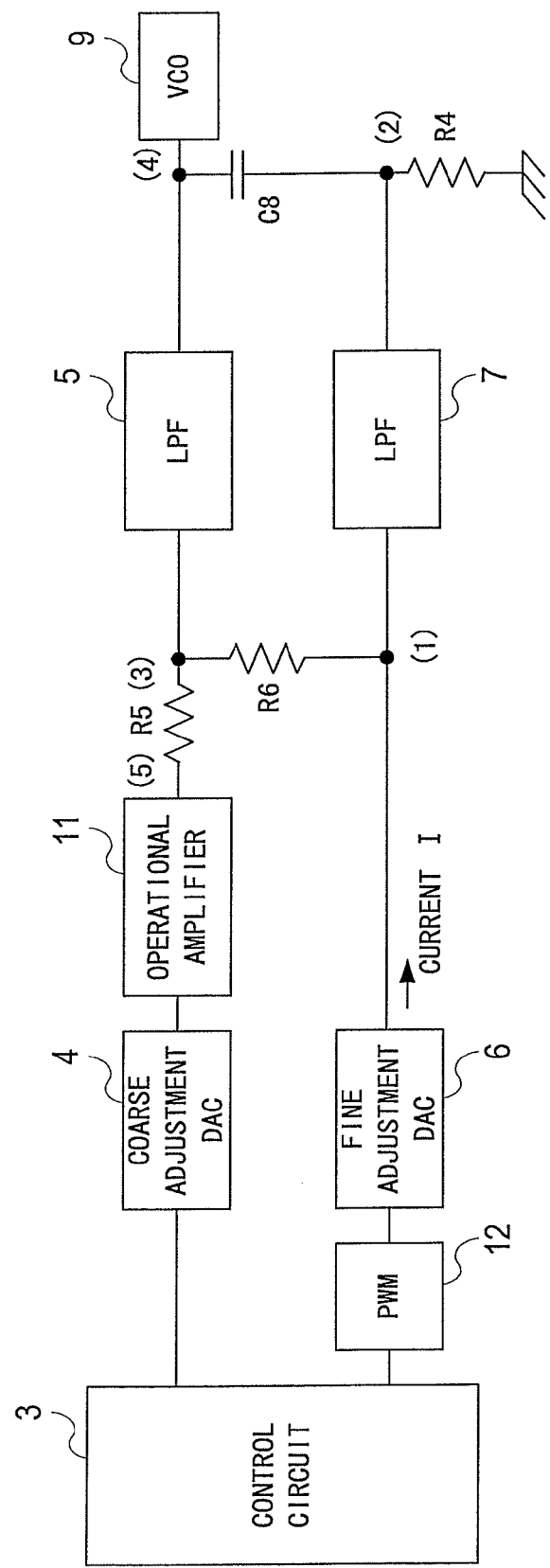
FIG. 2 is a configuration diagram of a first VCO driving circuit according to an embodiment of the present invention.

[First VCO Driving Circuit: FIG. 2]

Next, a specific configuration of the VCO driving circuit will be described with reference to FIG. 2. FIG. 2 shows a configuration diagram of a first VCO driving circuit according to an embodiment of the present invention.

The first VCO driving circuit (first VCO driving circuit) according to the embodiment of the present invention, as shown in FIG. 2, includes: a control circuit 3; a coarse adjustment DAC 4 that receives digital data having a coarse adjustment frequency from the control circuit 3 and converts the digital data to analog data; an operational amplifier 11 that amplifies the output from the coarse adjustment DAC 4 by several orders of magnitude; a pulse width modulation circuit 12 that receives and performs PWM (pulse width modulation) on digital data having a fine adjustment frequency from the control circuit 3; a fine adjustment DAC 6 that converts the digital data from the pulse width modulation circuit 12 to analog data; an LPF 5 that smoothes out an output signal from the operational amplifier 11; and an LPF 7 that smoothes out an output signal from the fine adjustment DAC 6. A mixing means that mixes the coarse adjustment frequency voltage and the fine adjustment frequency voltage with each other to output the mixed voltage to a VCO 9 is configured by a combination of a resistor R and a capacitor C.

To describe the mixing means in detail, it is assumed that an output from the operational amplifier 11 is connected to a coarse adjustment line, and that an output from the fine adjustment DAC 6 is connected to a fine adjustment line. Then, a resistor R5 and the LPF 5 are connected in series to the coarse adjustment line and the output signal is input to a control terminal of the VCO 9.

Meanwhile, the LPF 7 and a resistor R4 are connected in series to the fine adjustment line, and the terminal end of the resistor R4 is connected to the ground.

In the coarse adjustment line and the fine adjustment line, a node (3) between the resistor R5 and the LPF 5 and a node (1) between the fine adjustment DAC 6 and the LPF 7 are connected to each other via a resistor R6, and moreover, a node (4) between the LPF 5 and the VCO 9 and a node (2) between the LPF 7 and the resistor R4 are capacitively coupled to each other via a capacitor C8.

The first VCO driving circuit has a configuration of a type wherein the output from the fine adjustment DAC 6 is a current. That is, although the coarse adjustment line is driven by a voltage, the fine adjustment line has a configuration wherein the fine adjustment frequency is adjusted by an output current from the fine adjustment DAC 6.

The output from the coarse adjustment DAC 4 is to apply a voltage that determines a rough VCO output frequency to the control terminal of the VCO 9.

As a PLL, a voltage that controls the VCO 9 is a current of the PWM signal from the fine adjustment DAC 6, and the PWM signal is smoothed by the LPF 7, coupled at the capacitor C8 with the output from the coarse adjustment DAC 4, amplified by the operational amplifier 11, and applied to the control terminal of the VCO 9.

The LPF may be an RC filter formed by a combination of a resistor R and a capacitor C, an LC filter formed by a combination of an inductor L and a capacitor C, or a filter formed by a combination of a resistor R, an inductor L, and a capacitor C.

By a DC component of the output of the fine adjustment DAC 6, a voltage V1 at node (1) can be expressed by V1=[(Resistance of LPF 7)+R4]×I, and a voltage V2 at node (2) can be expressed by V2=R4×I.

To prevent a DC component (2) of the fine adjustment DAC 6 from having influence on a DC component (4), the output from the fine adjustment DAC 6 is connected via the resistor R6 to the output of the coarse adjustment DAC 4. In this case, the respective resistors are designed to satisfy a relation of

[(Resistance of LPF 7)+R4]<<R6. Since the resistance of the resistor R6 is extremely larger than [(Resistance of LPF 7)+R4], the DC component of the coarse adjustment DAC 4 is not influenced by the DC component of the fine adjustment DAC 6.

Moreover, since the resistor R6 is connected, a coarse adjustment voltage (3) applied to the VCO control terminal is divided from the output voltage (5) from the operational amplifier 11 by the respective resistance of the resistors R5 and R6 and the LPF 7. However, since the resistance of the resistor R6 is extremely large, the coarse adjustment voltage (3) can be approximately expressed by [R6/(R5+R6)]×Voltage (5).

Furthermore, the LPF 7 has such a resistance that it operates as a resistor that converts the output of the fine adjustment DAC 6 to a voltage, and moreover, when a capacitor C is added to the LPF 7, the LPF 7 may operate as an LPF that smoothes out the PWM signal.

A noise component contained in the voltage applied to the VCO control terminal can cause degradation of phase noise characteristics in the output of the VCO 9 and spurious emission (unwanted wave). Therefore, the LPF 5 is configured as an LPF (coarse adjustment LPF) having a large time constant that removes noise from the output of the coarse adjustment DAC 4. To the contrary, the LPF 7 and the resistor R4 are configured as an LPF (fine adjustment LPF) having a small time constant.

The control voltage of the VCO 9 has a wide range of about 0 to 20 V. Since the control voltage is often required to be equal to or greater than a supply voltage of the DAC, the supply voltage is amplified by the operational amplifier 11. Therefore, the above-mentioned LPF having a large time constant is needed.

The operational amplifier 11 may not be used when the control voltage of the VCO 9 is low since the operational amplifier is used in order to amplify a voltage.

Figure 3:
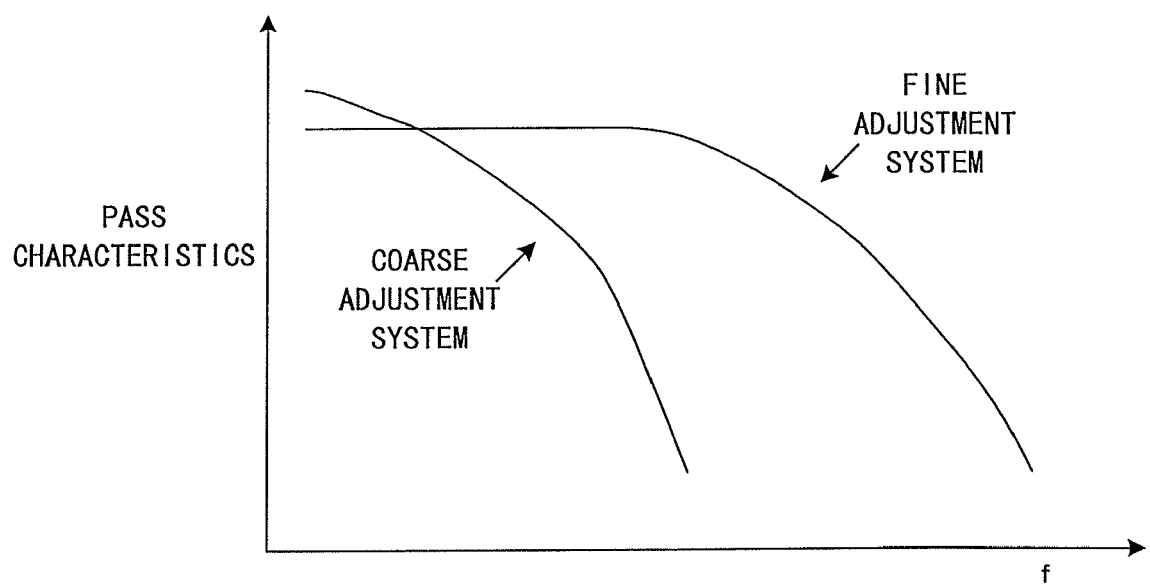
FIG. 3 is a diagram illustrating transmission characteristics.

[Transmission Characteristics: FIG. 3]

Next, the transmission characteristics of the first VCO driving circuit will be described with reference to FIG. 3. FIG. 3 shows a diagram illustrating the transmission characteristics from the respective DACs to the node (4). In the drawing, a horizontal axis represents a frequency, and a vertical axis represents attenuation.

Specifically, FIG. 3 shows the pass characteristics of the coarse adjustment line regarding the coarse adjustment DAC 4 and the pass characteristics of the fine adjustment line regarding the fine adjustment DAC 6.

Referring to FIG. 3, when the respective time constants in FIG. 2 are determined, the transmission characteristics show that the coarse adjustment LPF has a low cut-off frequency of about 26 Hz and that the response speed is low.

Moreover, referring to FIG. 3, when the respective time constants in FIG. 2 are determined, the transmission characteristics show that the fine adjustment LPF has a high cut-off frequency of about 344 kHz and that the response speed is higher than that of the coarse adjustment LPF.

Figure 4:
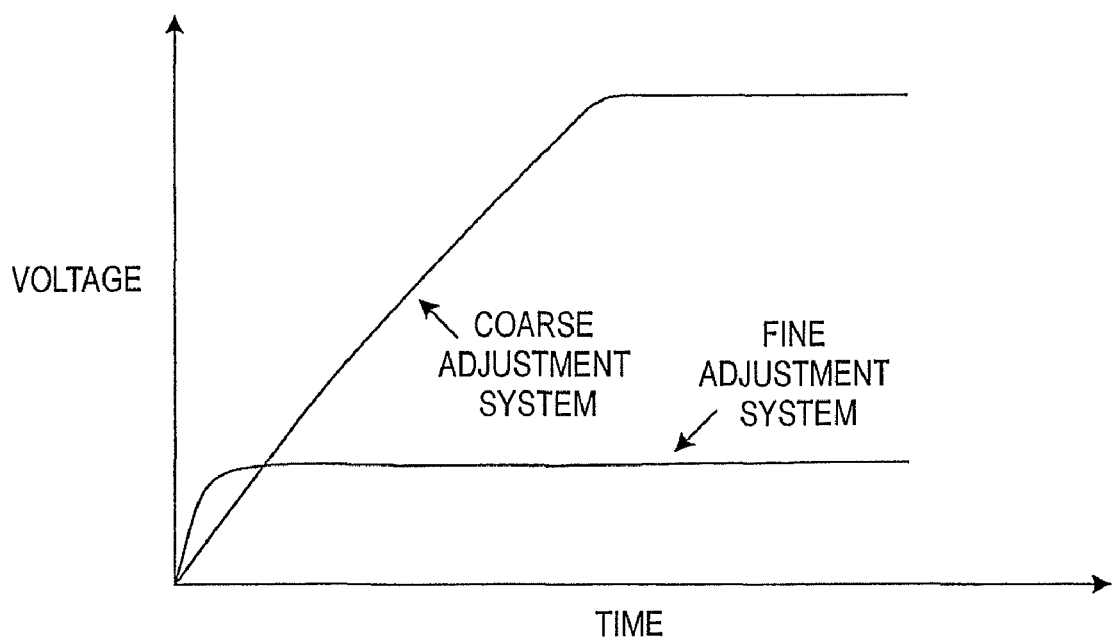
FIG. 4 is a diagram illustrating time response characteristics.

[Time Response Characteristics: FIG. 4]

Next, the time response characteristics of the first VCO driving circuit will be described with reference to FIG. 4. FIG. 4 shows a diagram illustrating the time response characteristics from the respective DACs to the node (4). In the drawing, a horizontal axis represents a time, and a vertical axis represents a voltage.

Specifically, FIG. 4 shows the time response characteristics of the coarse adjustment line regarding the coarse adjustment DAC 4 and the time response characteristics of the fine adjustment line regarding the fine adjustment DAC 6.

Referring to FIG. 4, the coarse adjustment system shows a smooth time response, and the fine adjustment system shows steep time response.

Figure 5:
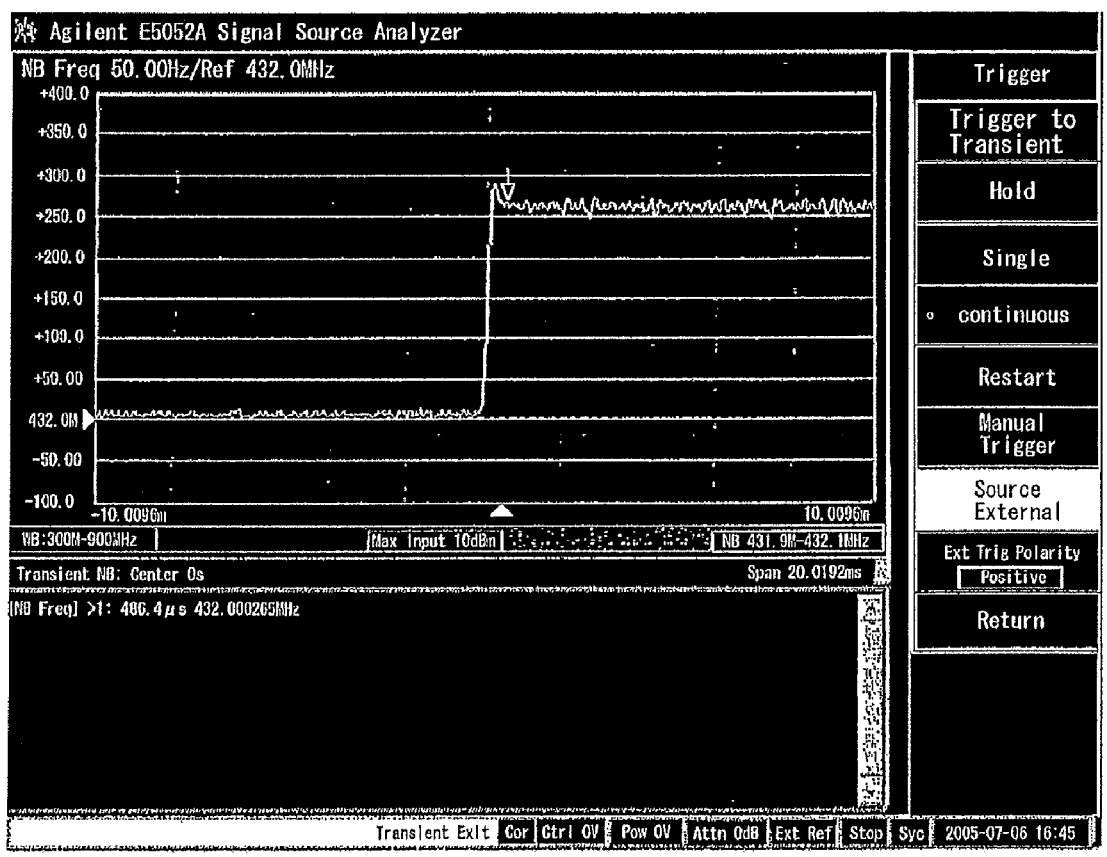
FIG. 5 is a diagram illustrating a lock time of the first VCO driving circuit.

FIG. 5 shows a diagram illustrating a lock time of the first VCO driving circuit. As shown in FIG. 5, the first VCO driving circuit shows excellent lock time characteristics.

Figure 6:
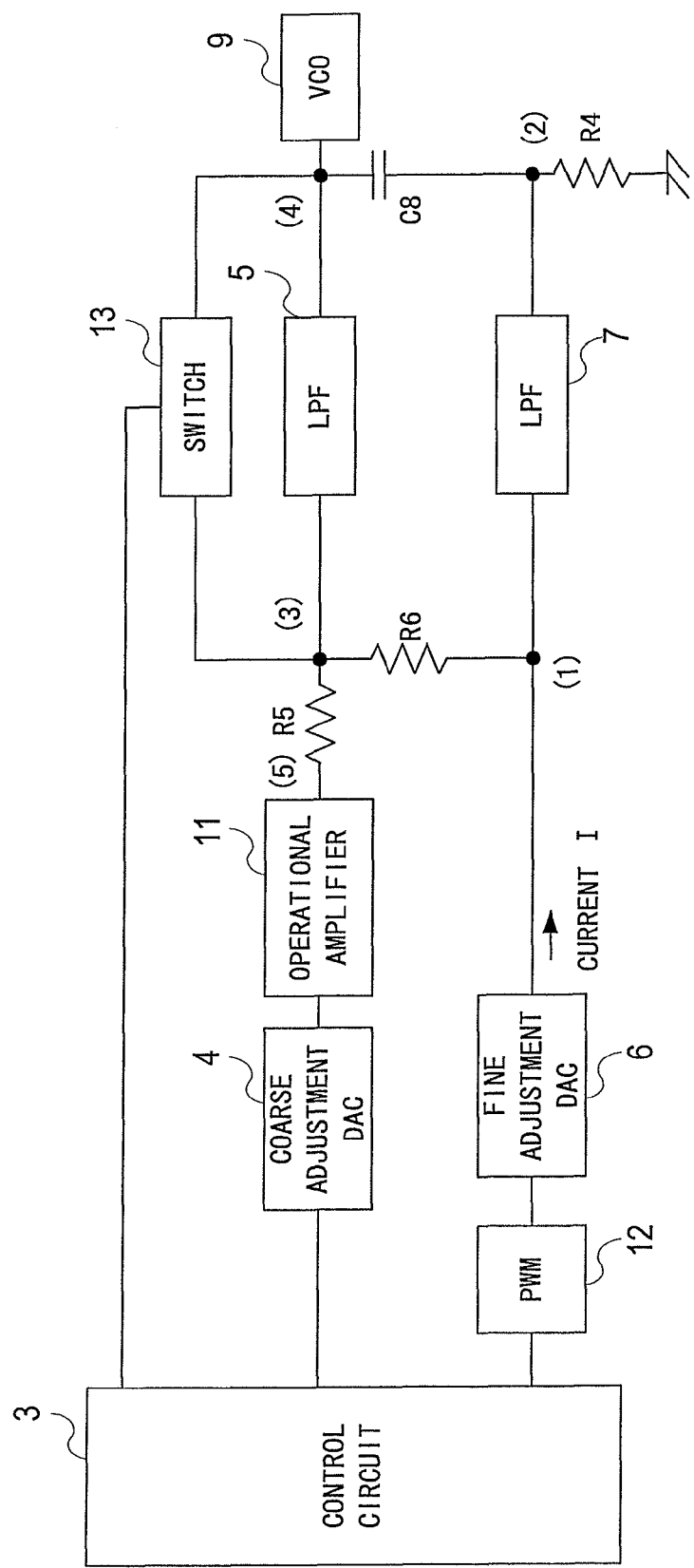
FIG. 6 is a configuration diagram of a second VCO driving circuit according to an embodiment of the present invention.

[Second VCO Driving Circuit: FIG. 6]

Next, a second VCO driving circuit (second VCO driving circuit) according to the embodiment of the present invention will be described with reference to FIG. 6. FIG. 6 shows a configuration diagram of the second VCO driving circuit according to the embodiment of the present invention.

The second VCO driving circuit, as shown in FIG. 6, is provided with a switch 13 that connects the node (3) between the resistor R5 and the LPF 5 and the node (4) between the LPF 5 and the VCO 9 to each other. The switch 13 is open or closed by the control of the control circuit 3.

When the switch 13 is open, the two nodes are disconnected from each other so that charges are stored in the capacitor C8 via the LPF 5. On the other hand, when the switch 13 is closed, the two nodes are connected to each other so that a voltage at the rear of the resistor R5 is applied to the node (4), and thus charges are instantaneously stored in the capacitor C8.

By providing the switch 13 and turning on (closing) the switch instantaneously (for several μsec) at an early stage of voltage application to the VCO 9, it is possible to shorten the response time.

This is because the output of the coarse adjustment DAC 4 is connected to the LPF having a large time constant, the lock time is increased; therefore the switch 13 is provided to shorten the lock time.

Figure 7:
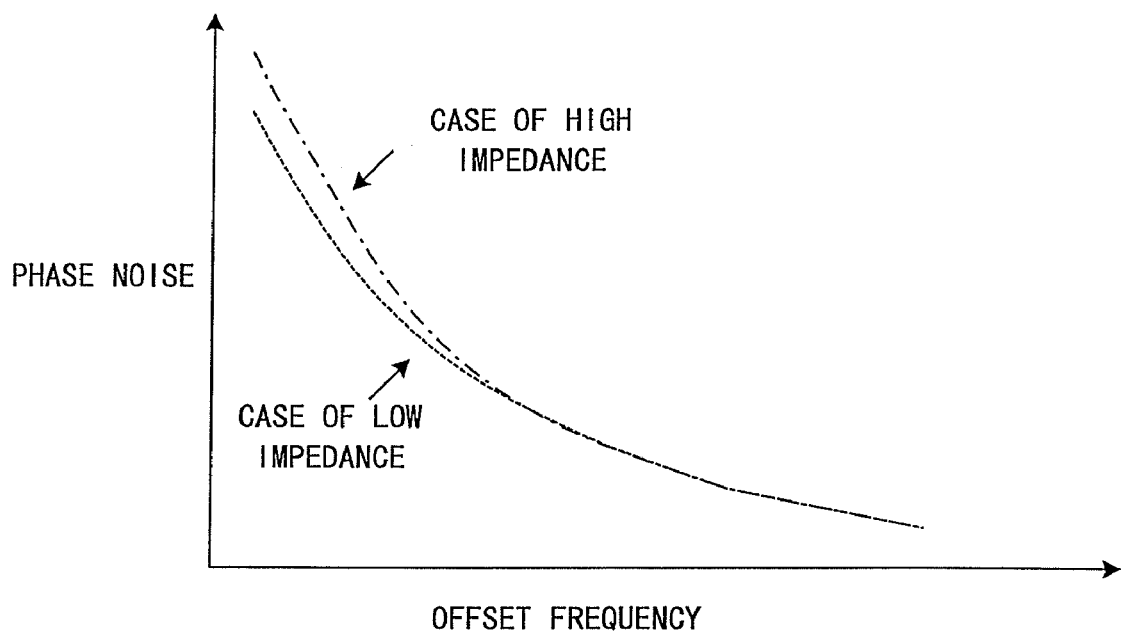
FIG. 7 is a diagram illustrating the VCO phase noise characteristics.

[VCO Phase Noise Characteristics: FIG. 7]

Next, the VCO phase noise characteristics in the second VCO driving circuit will be described with reference to FIG. 7. FIG. 7 shows a diagram illustrating the VCO phase noise characteristics.

As described in PROBLEMS TO BE SOLVED BY THE INVENTION, in the case of high impedance, there is a case where the VCO phase noise characteristics are not suppressed even when the PLL is successfully locked. However, in the first VCO driving circuit, it is possible to reduce the impedance as viewed from the VCO control terminal.

That is, in the first VCO driving circuit, since the impedance as viewed from the VCO control terminal is determined by the capacitor C8 and the resistor R4, the impedance can be reduced by decreasing the resistance of the resistor R4. In the present invention, when the resistor R4 has a resistance of several tens of ohms, it is possible to reduce the impedance and to thereby prevent degradation of the VCO phase noise characteristics.

Figure 8:
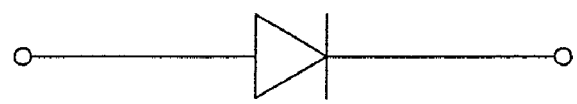
FIG. 8 is a first circuit diagram of a switch.
Figure 9:
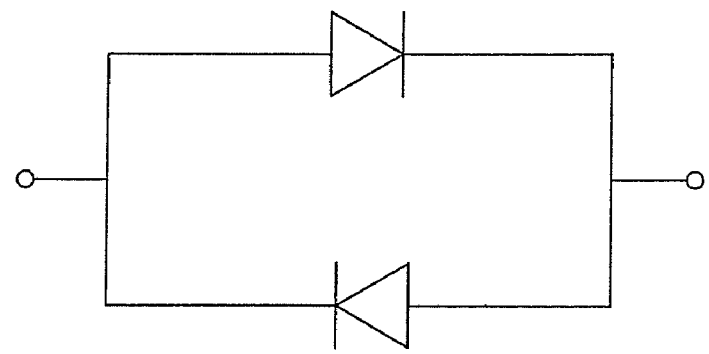
FIG. 9 is a second circuit diagram of a switch.

A configuration of the switch 13 is shown in FIGS. 8 and 9. FIG. 8 shows a first circuit diagram of the switch, and FIG. 9 is a second circuit diagram of the switch.

FIG. 8 shows a simplest configuration in which a diode is used as a switch. FIG. 9 shows a configuration in which a parallel connection of reverse-biased diodes is used as a switch.

In the configuration of FIG. 9, charging is performed by means of an upper diode, and discharging is performed by means of a lower diode.

When the switch of FIG. 9 is used, during power-on or frequency tuning, charging and discharging of the capacitor C8 is performed instantaneously by opening/closing of the switch 13, whereby the lock time is reduced by the charging, and thereafter, discharging is performed so that a normal control can be performed in the VCO driving circuit of FIG. 2.

When the switches shown in FIGS. 8 and 9 are used, it is not necessary for the control circuit 3 to issue a control command. However, when the switch 13 is a mechanical switch, it is necessary for the control circuit 3 to apply an ON/OFF timing signal such as during power-on.

Figure 10:
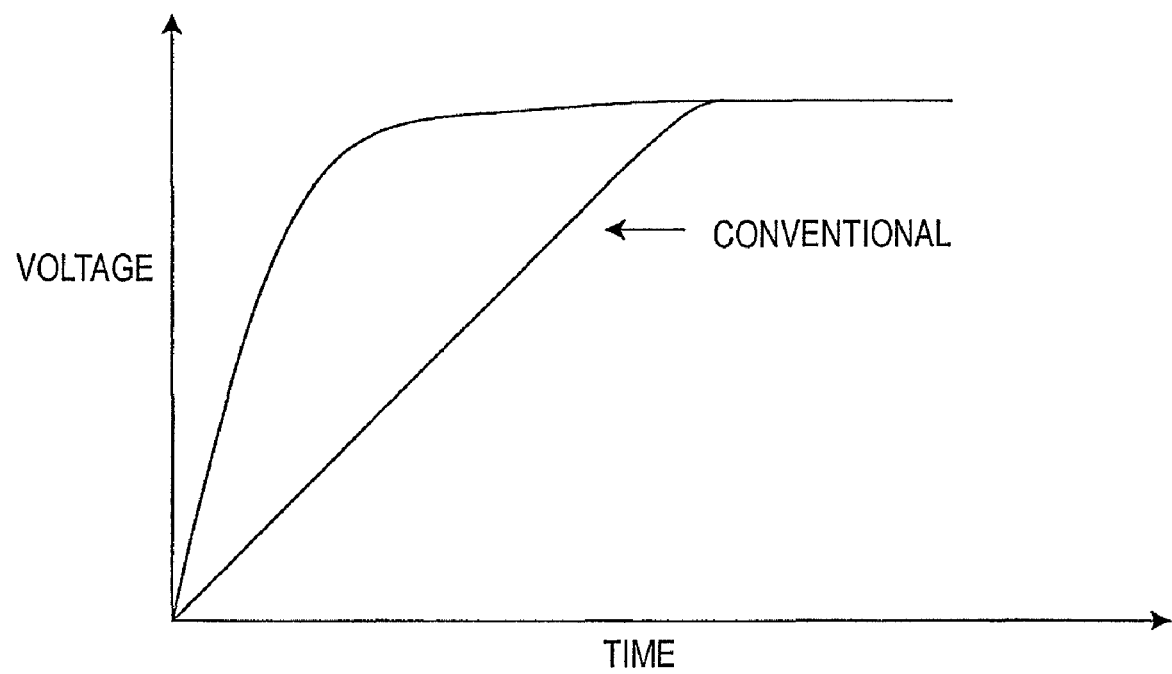
FIG. 10 is a diagram illustrating time response characteristics of the second VCO driving circuit.

[Time Response Characteristics: FIG. 10]

The time response characteristics of the second VCO driving circuit are illustrated in FIG. 10. FIG. 10 shows a diagram illustrating the time response characteristics of a first improved VCO driving circuit. In FIG. 10, the time response characteristics of the voltage at node (4) are illustrated when the output of the fine adjustment DAC 6 is fixed at 0 V while the output of the coarse adjustment DAC 4 changes from 0 to 5 V.

According to the time response characteristics, the response time is shortened compared with the present VCO driving circuit, and thus the lock time is shortened.

Figure 11:
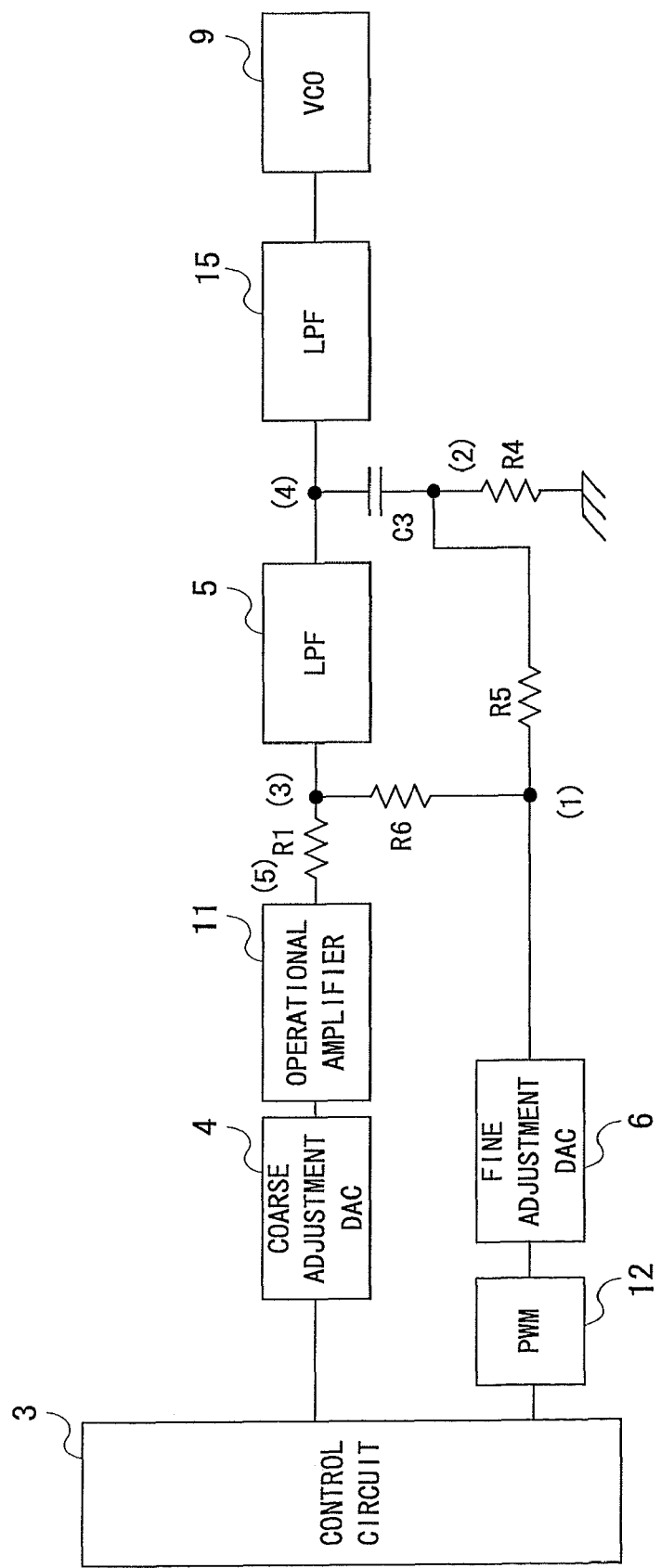
FIG. 11 is a configuration diagram of a third VCO driving circuit according to an embodiment of the present invention.

[Third VCO Driving Circuit: FIG. 11]

Next, a third VCO driving circuit (third VCO driving circuit) according to the embodiment of the present invention will be described with reference to FIG. 11. FIG. 11 shows a configuration diagram of the third VCO driving circuit according to the embodiment of the present invention.

In the third VCO driving circuit, as shown in FIG. 11, the output of the control circuit 3 is input to the control terminal of the VCO 9 via the coarse adjustment line to which the coarse adjustment DAC 4, the operational amplifier 11, a resistor R1, the LPF 5, and an LPF 15 are connected in series.

One end of a capacitor C3 is connected between the LPF 5 and the LPF 15, and the other end thereof is connected to the ground via a resistor R4.

The LPF may be an RC filter formed by a combination of a resistor R and a capacitor C, a zero-impedance LC filter formed by a combination of an inductor L and a capacitor C, or a filter formed by a combination of a resistor R, an inductor L, and a capacitor C.

Meanwhile, the output from the control circuit 3 is connected to the fine adjustment line to which the PWM 12, the fine adjustment DAC 6, and resistors R5 and R4 are connected in series, and the terminal end of the resistor R4 is connected to the ground.

A node (3) between the resistor R1 and the LPF 5 of the coarse adjustment line and a node (1) between the fine adjustment DAC 6 and the resistor R5 of the fine adjustment line are connected to each other via the resistor R6.

Moreover, a node (4) between the LPF 5 and the LPF 15 of the coarse adjustment line and a node (2) between the resistor R5 and the resistor R4 of the fine adjustment line are capacitively coupled to each other via a capacitor C3.

The third VCO driving circuit has a configuration of a type wherein the output from the fine adjustment DAC 6 is a voltage. That is, the coarse adjustment line is driven by a voltage, and the fine adjustment line is also driven by a voltage. A basic operation principle is the same as that of the first VCO driving circuit of the current output type.

In the third VCO driving circuit, the output of the coarse adjustment DAC 4 determines a rough VCO output frequency, and the PWM signal of the output of the fine adjustment DAC 6 controls the PLL.

The PWM signal of the output of the fine adjustment DAC 6 is added at the capacitor C3 to the output of the coarse adjustment DAC 4

To prevent a DC component (1) of the fine adjustment DAC 6 of the fine adjustment line from having influence on a DC component (4) of the coarse adjustment line, the resistor R6 is connected between them. In particular, when the resistance of the resistor R6 is designed sufficiently larger than the total resistance of the resistors R5 and R4, the influence can be decreased.

Here, the LPF 15 is configured as an LPF (third LPF) that smoothes out the PWM signal.

Moreover, the resistor R1 and the LPF 5 are configured as an LPF having a large time constant that removes noise from the output of the coarse adjustment DAC 4.

Figure 12:
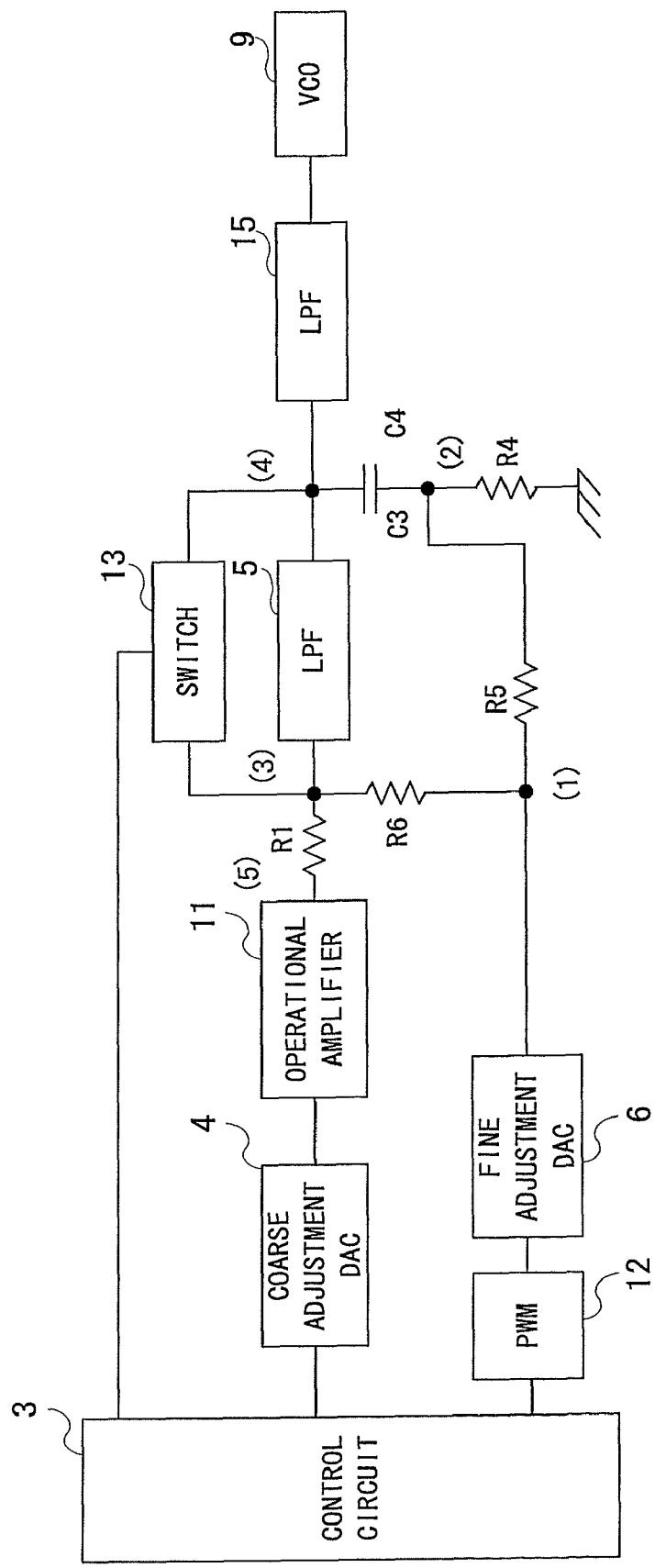
FIG. 12 is a configuration diagram of a fourth VCO driving circuit according to an embodiment of the present invention.

[Fourth VCO Driving Circuit: FIG. 12]

Next, a fourth VCO driving circuit (fourth VCO driving circuit) according to the embodiment of the present invention will be described with reference to FIG. 12. FIG. 12 shows a configuration diagram of the fourth VCO driving circuit according to the embodiment of the present invention.

The fourth VCO driving circuit has a configuration wherein similar to the second VCO driving circuit, the switch 13 is provided to the third VCO driving circuit.

The operation is the same as that of the second VCO driving circuit. As a switch, the configurations shown in FIGS. 8 and 9 or a mechanical switch can be used. When the switch 13 is a mechanical switch, an ON/OFF timing signal is applied from the control circuit 3.

According to the fourth VCO driving circuit, the fine adjustment line is configured to be driven by a voltage, and by the operation of the switch 13, charging/discharging is performed by opening/closing of the switch 13 during power-on or frequency tuning. It is, therefore, possible to provide an advantage that the lock time is reduced.

Figure 13:
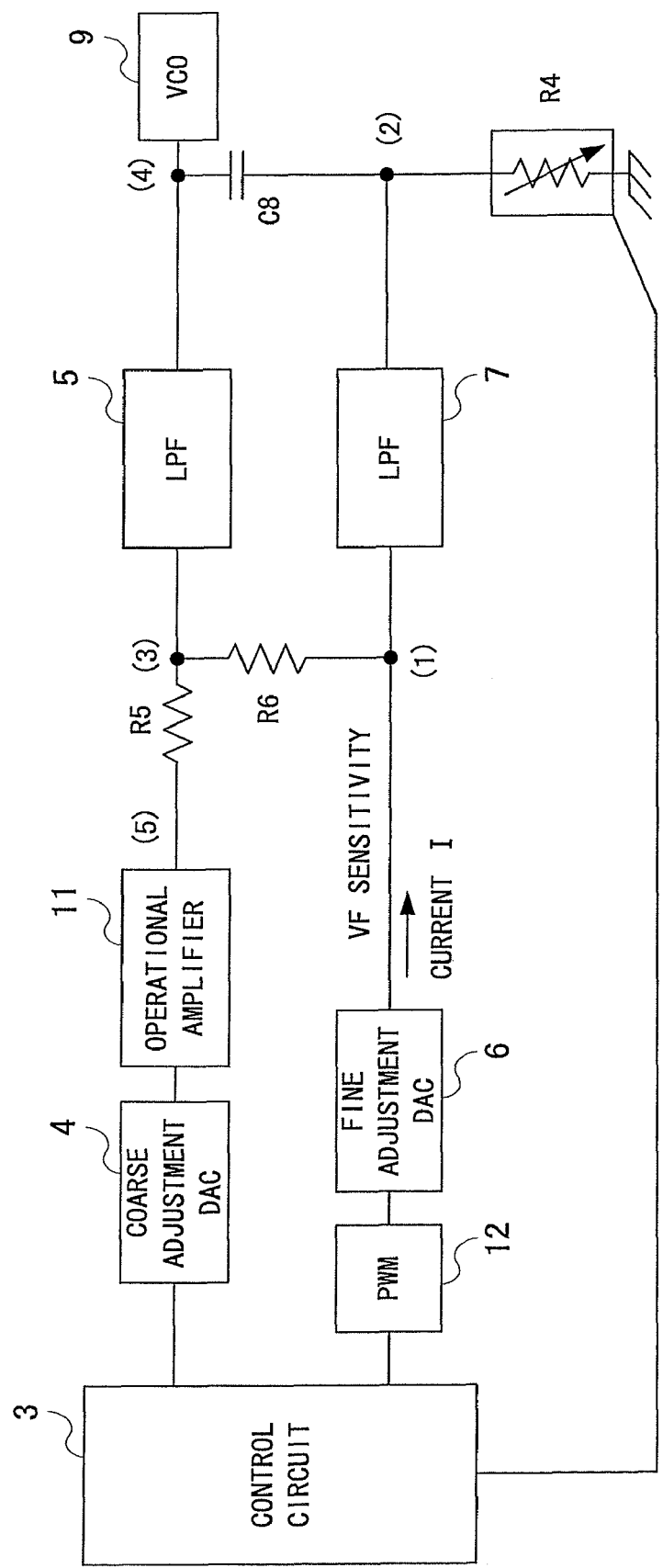
FIG. 13 is a configuration diagram of a fifth VCO driving circuit according to an embodiment of the present invention.

[Fifth VCO Driving Circuit: FIG. 13]

Next, a fifth VCO driving circuit according to the embodiment of the present invention will be described with reference to FIG. 13. FIG. 13 shows a configuration diagram of the fifth VCO driving circuit according to the embodiment of the present invention.

The fifth VCO driving circuit (fifth VCO driving circuit) according to the embodiment of the present invention, as shown in FIG. 13, includes: a control circuit 3; a coarse adjustment DAC 4 that receives digital data having a coarse adjustment frequency from the control circuit 3 and converts the digital data to analog data; an operational amplifier 11 that amplifies the output from the coarse adjustment DAC 4 by several orders of magnitude; a pulse width modulation circuit (PWM) 12 that receives and performs PWM (pulse width modulation) on digital data having a fine adjustment frequency from the control circuit 3; a fine adjustment DAC 6 that converts the digital data from the pulse width modulation circuit 12 to analog data; an LPF 5 that smoothes out an output signal from the operational amplifier 11; and an LPF 7 that smoothes out an output signal from the fine adjustment DAC 6. A mixing means that mixes the coarse adjustment frequency voltage and the fine adjustment frequency voltage with each other to output the mixed voltage to a VCO 9 is configured by a combination of a resistor R and a capacitor C.

To describe the mixing means in detail, it is assumed that an output from the operational amplifier 11 is connected to a coarse adjustment line, and that an output from the fine adjustment DAC 6 is connected to a fine adjustment line. Then, a resistor R5 and the LPF 5 are connected in series to the coarse adjustment line and the output signal is input to a control terminal of the VCO 9.

Meanwhile, the LPF 7 and a variable resistor R4 are connected in series to the fine adjustment line, and the terminal end of the variable resistor R4 is connected to the ground.

In the coarse adjustment line and the fine adjustment line, a node (3) between the resistor R5 and the LPF 5 and a node (1) between the fine adjustment DAC 6 and the LPF 7 are connected to each other via a resistor R6, and moreover, a node (4) between the LPF 5 and the VCO 9 and a node (2) between the LPF 7 and the variable resistor R4 are capacitively coupled to each other via a capacitor C8.

The variable resistor R4 is a resistor, such as a digital potentiometer, of which the resistance is variable by a digital signal. The variable resistance of the variable resistor R4 is controlled by the control circuit 3. Since the variable resistor R4 controls a voltage by varying the variable resistance, it can be called a voltage control means.

The fifth VCO driving circuit has a configuration of a type wherein the output from the fine adjustment DAC 6 is a current. That is, although the coarse adjustment line is driven by a voltage, the fine adjustment line has a configuration wherein the fine adjustment frequency is adjusted by an output current from the fine adjustment DAC 6.

The output from the coarse adjustment DAC 4 is to apply a voltage that determines a rough VCO output frequency to the control terminal of the VCO 9.

As a PLL, a voltage that controls the VCO 9 is a current of the PWM signal from the fine adjustment DAC 6, and the PWM signal is smoothed by the LPF 7, coupled at the capacitor C8 with the output from the coarse adjustment DAC 4, amplified by the operational amplifier 11, and applied to the control terminal of the VCO 9.

The LPF may be an RC filter formed by a combination of a resistor R and a capacitor C, an LC filter formed by a combination of an inductor L and a capacitor C, or a filter formed by a combination of a resistor R, an inductor L, and a capacitor C.

By a DC component of the output of the fine adjustment DAC 6, a voltage V1 at an output stage of the fine adjustment DAC 6 can be expressed by V1=[(Resistance of LPF 7)+R4]×I (current), and a voltage V2 at an input stage of the variable resistor R4 can be expressed by R4×I.

To prevent a DC component of the fine adjustment DAC 6 from having influence on a DC component at an input stage of the VCO 9, the output from the fine adjustment DAC 6 is connected via the resistor R6 to the output of the coarse adjustment DAC 4. In this case, the respective resistors are designed to satisfy a relation of [(Resistance of LPF 7)+R4] <<R6. Since the resistance of the resistor R6 is extremely larger than [(Resistance of LPF 7)+R4], the DC component of the coarse adjustment DAC 4 is not influenced by the DC component of the fine adjustment DAC 6.

Moreover, since the resistor R6 is connected, a coarse adjustment voltage applied to the VCO control terminal is divided from the output voltage from the operational amplifier 11 by the respective resistance of the resistors R5 and R6 and the LPF 7. However, since the resistance of the resistor R6 is extremely large, the coarse adjustment voltage (3) can be approximately expressed by [R6/(R5+R6)]×V (voltage).

Furthermore, the LPF 7 has such a resistance that it operates as a resistor that converts the output of the fine adjustment DAC 6 to a voltage, and moreover, when a capacitor C is added to the LPF 7, the LPF 7 may operate as an LPF that smoothes out the PWM signal.

A noise component contained in the voltage applied to the VCO control terminal can cause degradation of phase noise characteristics in the output of the VCO 9 and spurious emission (unwanted wave). Therefore, the LPF 5 is configured as an LPF (coarse adjustment LPF) having a large time constant and having frequency pass characteristics (having a low response speed) that allow only a low frequency component to pass therethrough in order to remove noise from the output of the coarse adjustment DAC 4. To the contrary, the LPF 7 and the variable resistor R4 are configured as an LPF (fine adjustment LPF) having a small time constant and having frequency pass characteristics (having a high response speed) that allow high frequency components to pass therethrough.

The control voltage of the VCO 9 has a wide range of about 0 to 20 V. Since the control voltage is often required to be equal to or greater than a supply voltage of the DAC, the supply voltage is amplified by the operational amplifier 11. Therefore, the above-mentioned LPF having a large time constant is needed.

The operational amplifier 11 may not be used when the control voltage of the VCO 9 is low since the operational amplifier is used in order to amplify a voltage.

In the fifth VCO driving circuit, since the impedance as viewed from the VCO control terminal is determined by the capacitor C8 and the variable resistor R4, the impedance can be reduced by decreasing the resistance of the variable resistor R4. In the present invention, when the variable resistor R4 has a resistance of several tens of ohms, it is possible to reduce the impedance and to thereby prevent degradation of the VCO phase noise characteristics.

Next, details of the variable resistor R4 which is a characterizing part of the fifth VCO driving circuit will be described.

There is a case where the VF sensitivity Kv of the VCO 9 varies due to individual variations of the VCO 9. The variable resistor R4 is adjusted such that the VF sensitivity as viewed from the VCO 9 is maintained constant and is operable to maintain a constant natural frequency fn when the PLL is locked.

The variable resistor R4 is configured such that the resistance (control value) is controlled by the control circuit 3 in accordance with solid variations or temperature variations of the VCO 9. The controlled resistance is set by measuring the VF sensitivity of the VCO 9 through experiments and controlling the resistance so that the measured VF sensitivity is maintained constant.

Figure 14:
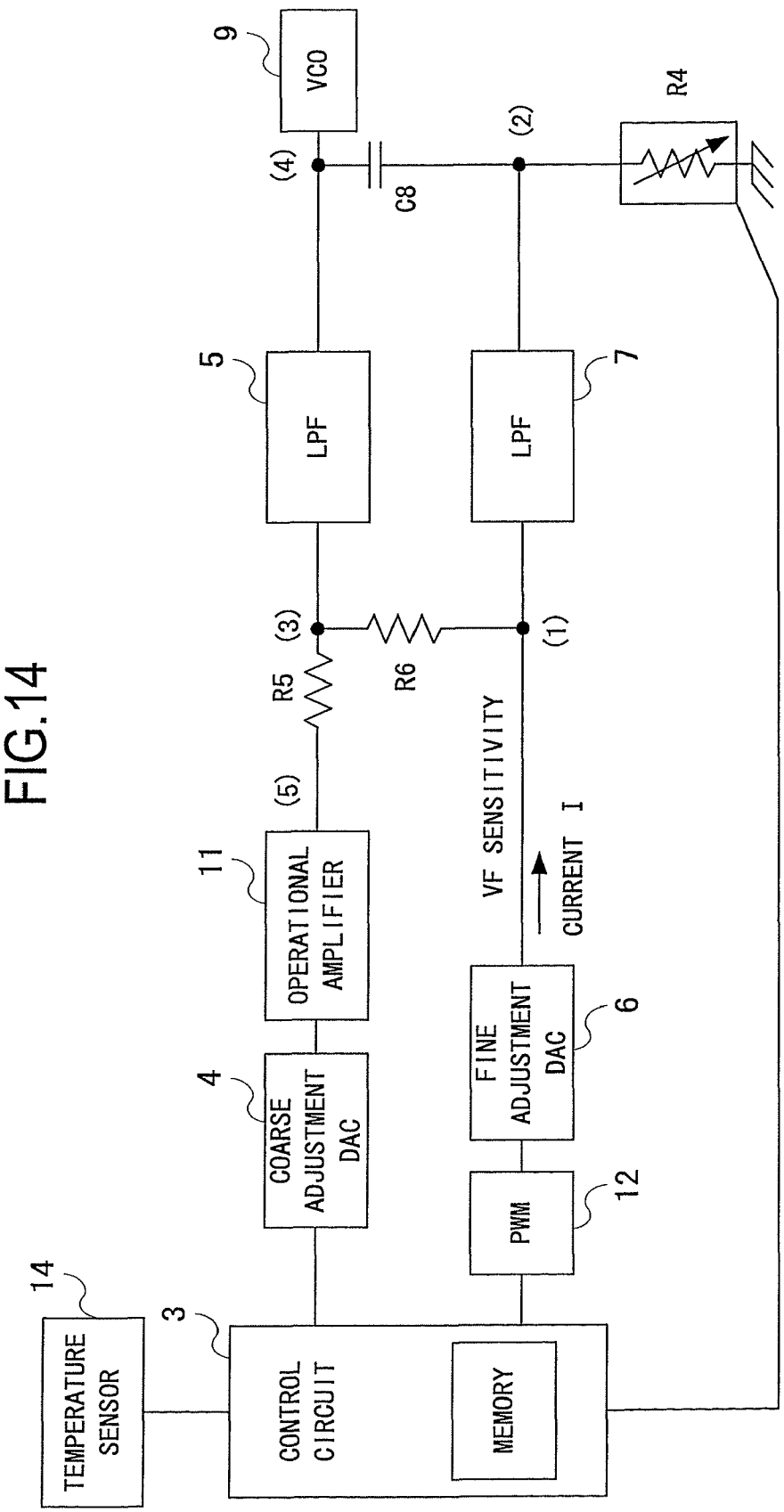
FIG. 14 is a configuration diagram of a sixth VCO driving circuit according to an embodiment of the present invention.

[Sixth VCO Driving Circuit: FIG. 14]

Next, a sixth VCO driving circuit according to the embodiment of the present invention will be described with reference to FIG. 14. FIG. 14 shows a configuration diagram of the sixth VCO driving circuit according to the embodiment of the present invention.

The sixth VCO driving circuit (sixth VCO driving circuit) according to the embodiment of the present invention, as shown in FIG. 14, is basically the same as the fifth VCO driving circuit, except that the sixth VCO driving circuit is provided with a temperature sensor 14 that is connected to the control circuit 3, and the temperature sensor 14 is installed in the vicinity of the VCO 9.

In the sixth VCO driving circuit, temperature is measured by the temperature sensor, and the measured temperature value is output as digital data to the control circuit 3. Therefore, the temperature sensor 14 can be called a temperature measurement means.

In the VCO 9, there is a case where the VF sensitivity Kv of the VCO 9 varies due to temperature variations. Similar to FIG. 13, the variable resistor R4 is adjusted such that the VF sensitivity as viewed from the VCO 9 is maintained constant and is operable to maintain a constant natural frequency fn when the PLL is locked.

[Relationship Between Variable Resistor R4 and VF Sensitivity: FIG. 15]

Next, an example where the resistance of the variable resistor R4 is varied to vary the VF sensitivity of the VCO 9 will be described with reference to FIG. 15. FIG. 15 shows a diagram illustrating the relationship between the variable resistor R4 and the VF sensitivity.

In FIG. 15, it is assumed that the VF sensitivity Kv of the VCO 9 is 30 MHz/V, for example, at room temperature and that the output (1) of the fine adjustment DAC 6 is controlled in the range of 0 to 0.8 V. In a first example [1] where the resistance of the LPF 7 is 10 and the resistance of the variable resistor R4 is 10, when the output of the fine adjustment DAC 6 is controlled at 0 V, a voltage (2) at a node of the variable resistor R4 close to the capacitor C8 becomes 0 V, while when the output of the fine adjustment DAC 6 is controlled at 0.8 V, the voltage (2) becomes 0.2 V.

Therefore, the VCO frequency variation can be calculated by ON sensitivity Kv)×(Voltage (2)), i.e., 30 [MHz/V]×0.2 [V]=6.0 MHz. Further, the VF sensitivity can be calculated by (30 [MHz/V]×(0.2 [V]/0.8 [V])=7.5 MHz/V.

In a second example [2] where the resistance of the LPF 7 is 10 and the resistance of the variable resistor R4 is 5, when the output of the fine adjustment DAC 6 is controlled at 0 V, the voltage (2) at the node of the variable resistor R4 close to the capacitor C8 becomes 0 V, while when the output of the fine adjustment DAC 6 is controlled at 0.8 V, the voltage (2) becomes 0.11 V.

Therefore, the VCO frequency variation can be calculated by (VF sensitivity Kv)×(Voltage (2)), i.e., 30 [MHz/V]×0.11 [V]=3.3 MHz. Further, the VF sensitivity can be calculated by (30 [MHz/V]×(0.11 [V]/0.8 [V])≈4.1 MHz/V.

Figure 16:
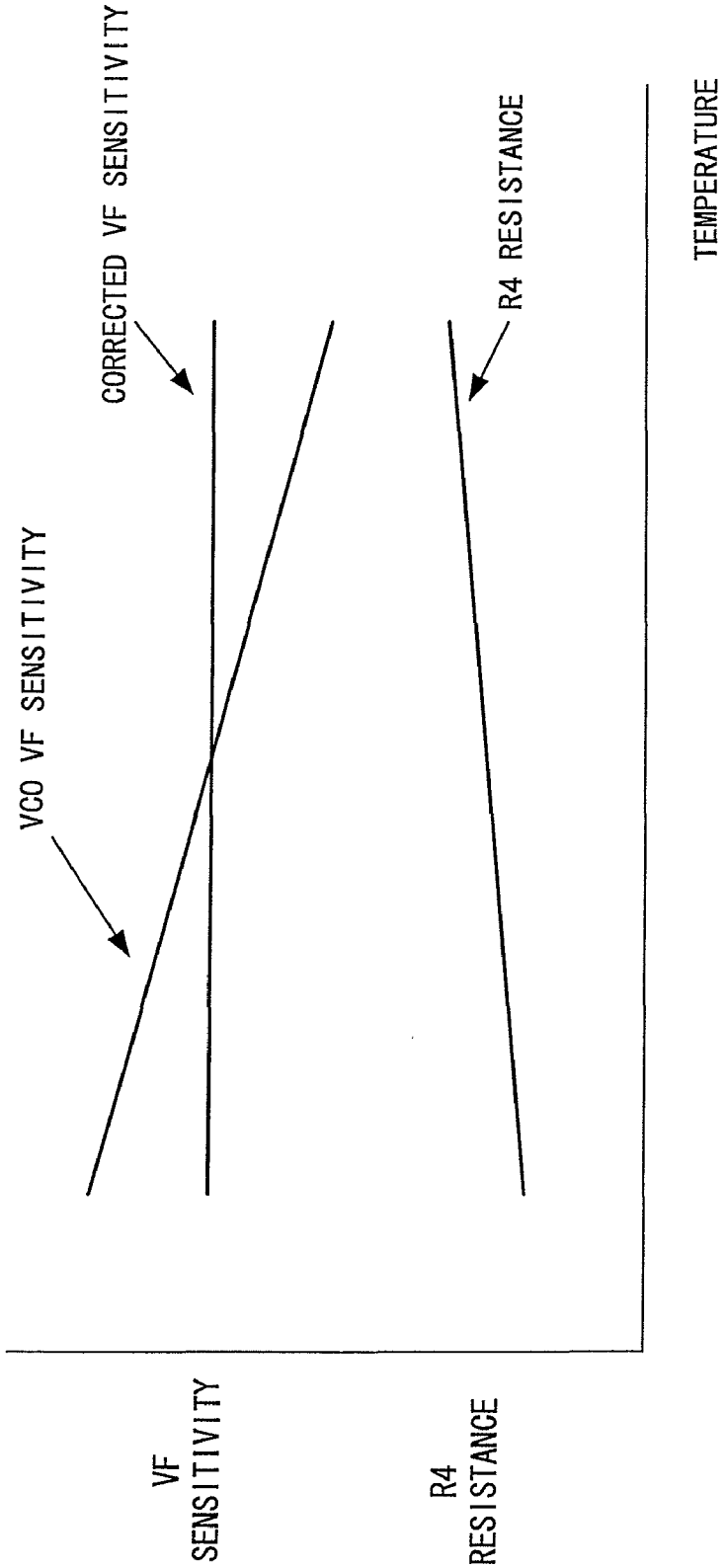
FIG. 16 is a diagram illustrating the relationship of VF sensitivity and the resistance of R4 relative to temperature.

[Relationship of VF Sensitivity and R4 Resistance Relative to Temperature: FIG. 16]

A control method of the second VCO driving circuit based on the above-described characteristics will be described with reference to FIG. 16. FIG. 16 shows a diagram illustrating the relationship of the VF sensitivity and the R4 resistance relative to temperature.

As shown in FIG. 16, the actual VF sensitivity of the VCO 9 decreases as the temperature increases. However, the VF sensitivity can be maintained constant by gradually increasing the resistance of the variable resistor R4 with the temperature increase. As a result, the natural frequency fn of the PLL can be maintained at a constant value.

Specifically, the temperature characteristics of the VF sensitivity Kv of the VCO 9 are obtained in advance through measurements, and the temperature characteristics (the relationship between the VF sensitivity relative to temperature and corresponding suitable R4 resistance) are stored as data in a memory (e.g., a ROM table) provided within the control circuit. Then, the control circuit 3 searches the memory based on the temperature detected by the temperature sensor 14 to thereby read in a corresponding suitable resistance so that the VF sensitivity reaches a target VF sensitivity, and sets the resistance (control value) of the variable resistor R4.

Figure 17:
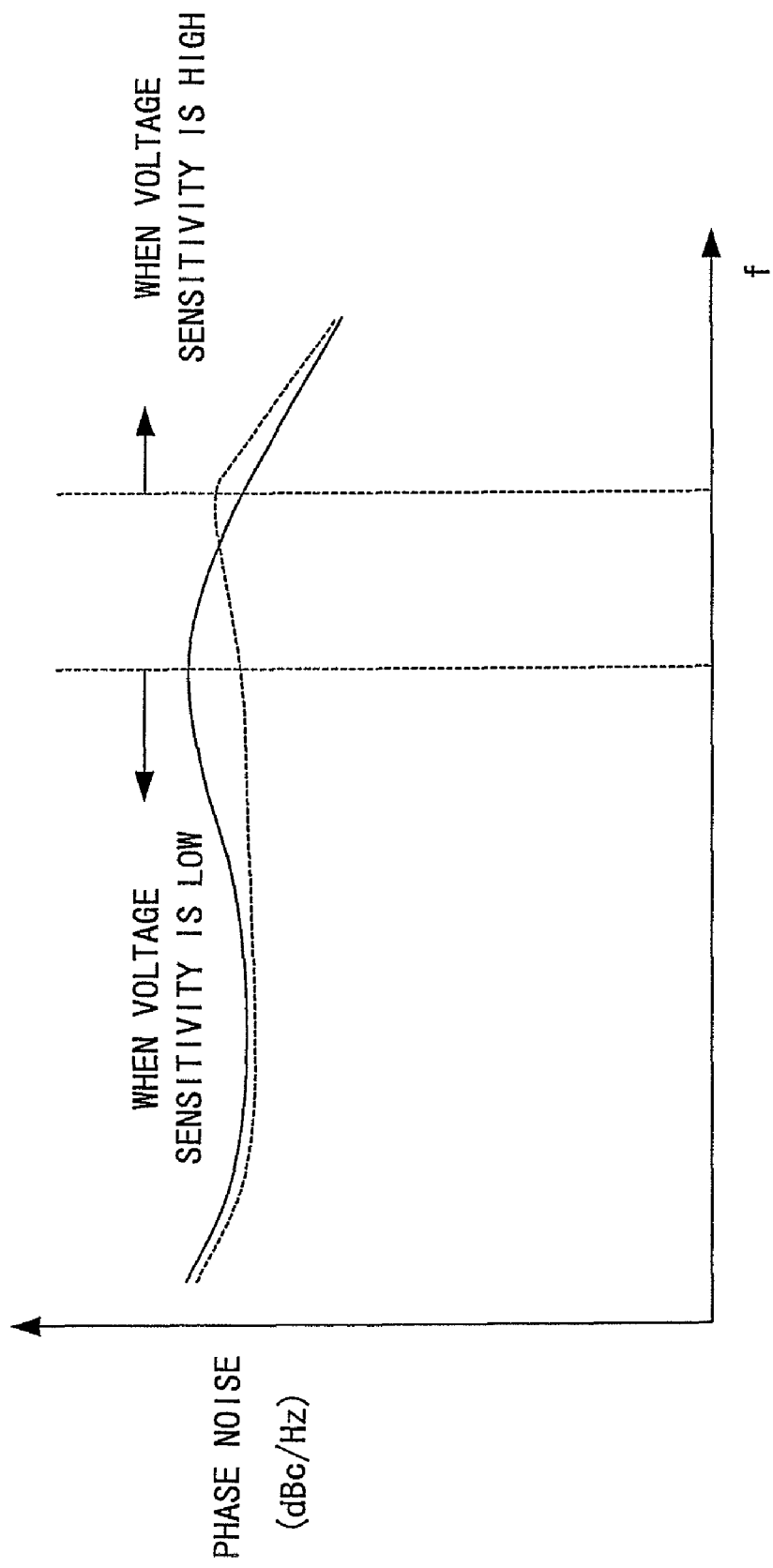
FIG. 17 is a diagram illustrating the VCO phase noise characteristics.

[VCO Phase Noise Characteristics: FIG. 17]

The VCO phase noise characteristics in the fifth and sixth VCO driving circuits are illustrated in FIG. 17. FIG. 17 shows a diagram illustrating the VCO phase noise characteristics. In FIG. 17, a horizontal axis represents an offset frequency from the carrier frequency, and a vertical axis represents phase noise, showing that the characteristics differ depending on whether the voltage sensitivity is low or high.

Figure 18:
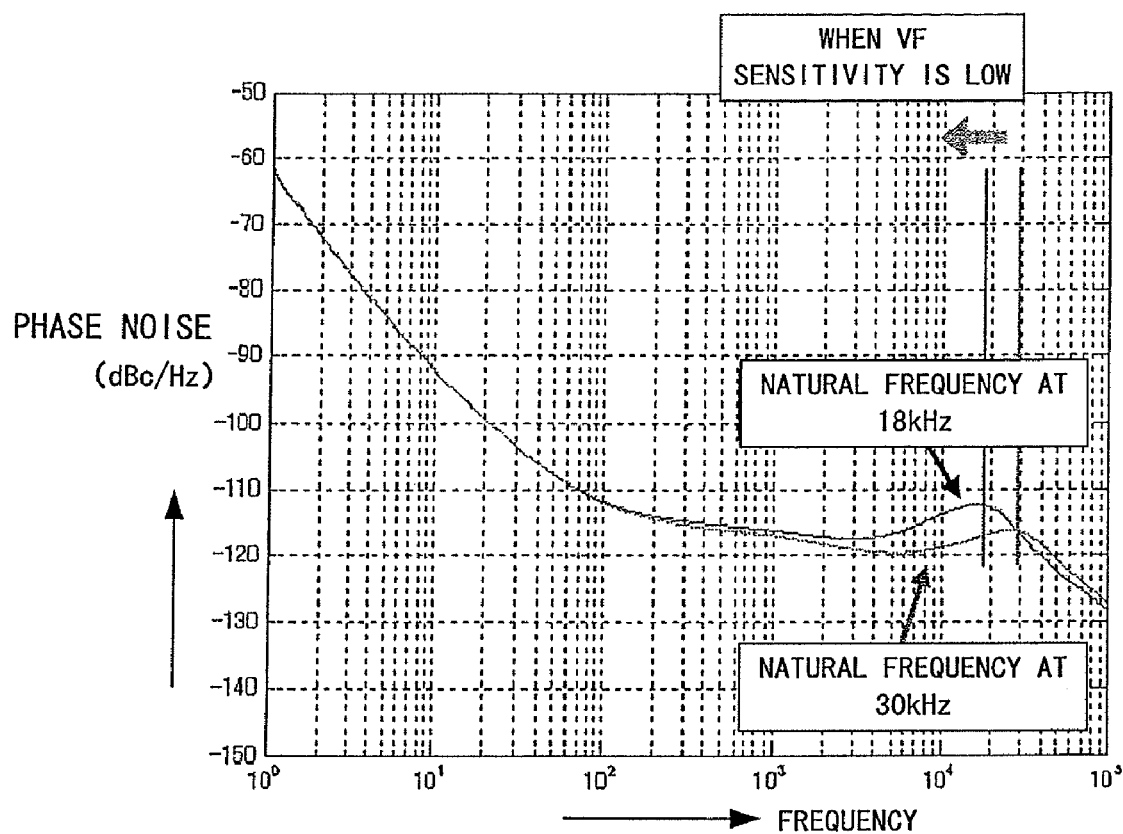
FIG. 18 is a diagram illustrating the VCO phase noise characteristics when temperature is low.
Figure 19:
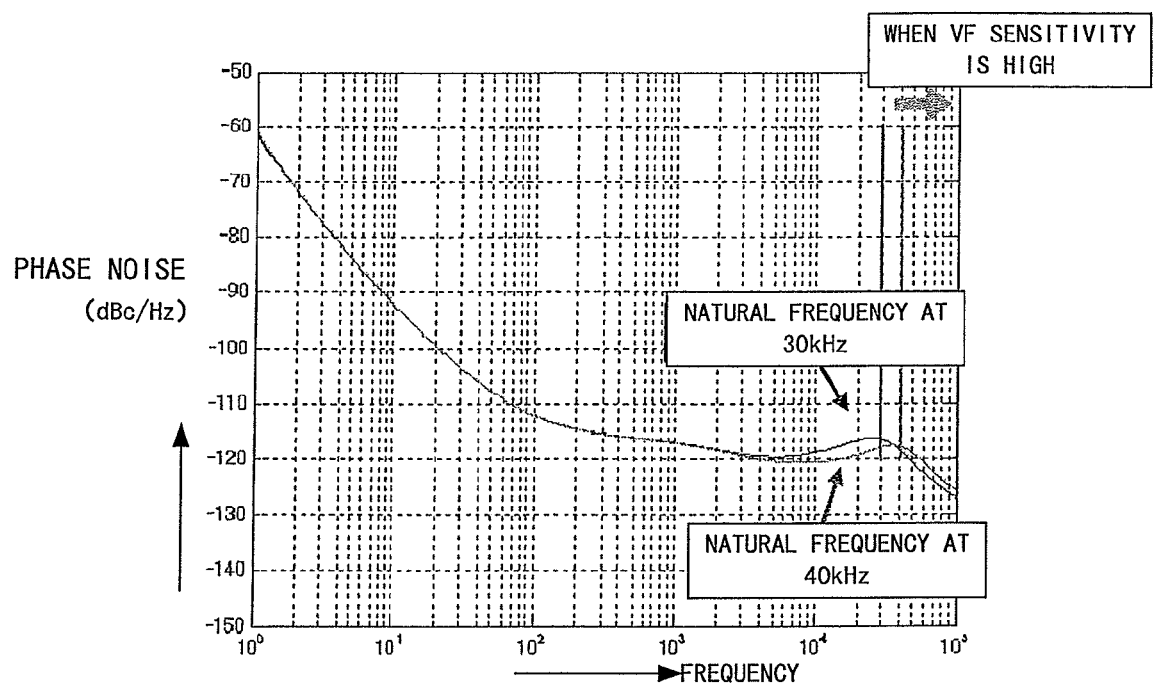
FIG. 19 is a diagram illustrating the VCO phase noise characteristics when temperature is high.

[Temperature-Dependent VCO Phase Noise Characteristics: FIGS. 18 and 19]

The VCO phase noise characteristics when temperature is high are illustrated in FIG. 18, and the VCO phase noise characteristics when temperature is low are illustrated in FIG. 19.

For example, assuming that the natural frequency is 30 kHz at room temperature (25° C.), when temperature increases, as shown in FIG. 18, the natural frequency decreases to 18 kHz, while when temperature decreases, as shown in FIG. 19, the natural frequency increases to 40 kHz. In FIGS. 18 and 19, a horizontal axis represents an offset frequency from the carrier frequency, and a vertical axis represents phase noise.

According to the fifth VCO driving circuit, by adjusting the solid variations of the VCO 9 by means of the variable resistor R4, it is possible to provide an advantage that the VF sensitivity can be maintained constant, and thus the PLL natural frequency fn can be maintained at a constant value.

According to the sixth VCO driving circuit, by adjusting the temperature variations of the VCO 9 by means of the variable resistor R4, it is possible to provide an advantage that the VF sensitivity can be maintained constant, and thus the PLL natural frequency fn can be maintained at a constant value.

Furthermore, by using a frequency synthesizer having the fifth VCO driving circuit or the sixth VCO driving circuit, it is possible to provide an advantage that the PLL natural frequency fn can be maintained at a constant value, and thus safety can be ensured.

Figure 20:
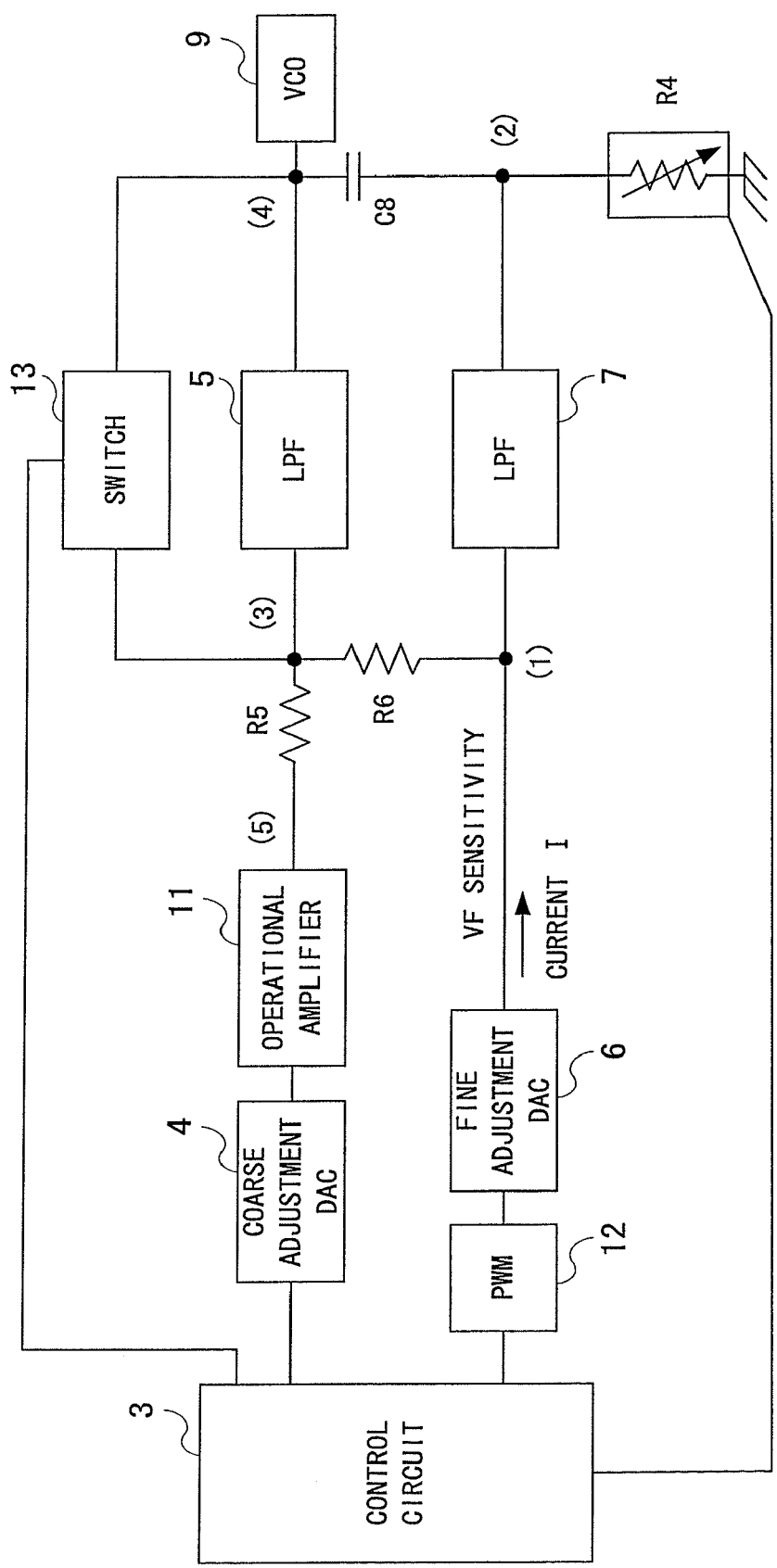
FIG. 20 is a configuration diagram of a seventh VCO driving circuit according to an embodiment of the present invention.

[Seventh VCO Driving Circuit: FIG. 20]

Next, a seventh VCO driving circuit (seventh VCO driving circuit) according to the embodiment of the present invention will be described with reference to FIG. 20. FIG. 20 shows a configuration diagram of the seventh VCO driving circuit according to the embodiment of the present invention.

The seventh VCO driving circuit, as shown in FIG. 20, is the same as the fifth VCO driving circuit, except that the seventh VCO driving circuit is further provided with a switch 13 that connects the node (3) between the resistor R5 and the LPF 5 and the node (4) between the LPF 5 and the VCO 9 to each other. The switch 13 is open or closed by the control of the control circuit 3.

When the switch 13 is open, the two nodes are disconnected from each other so that charges are stored in the capacitor C8 via the LPF 5. On the other hand, when the switch 13 is closed, the two nodes are connected to each other so that a voltage at the rear of the resistor R5 is applied to an input side of the VCO 9, and thus charges are instantaneously stored in the capacitor C8.

By providing the switch 13 and turning on (closing) the switch instantaneously (for several μsec) at an early stage of voltage application to the VCO 9, it is possible to shorten the response time.

This is because the output of the coarse adjustment DAC 4 is connected to the LPF having a large time constant, the lock time is increased; therefore the switch 13 is provided to shorten the lock time.

Figure 21:
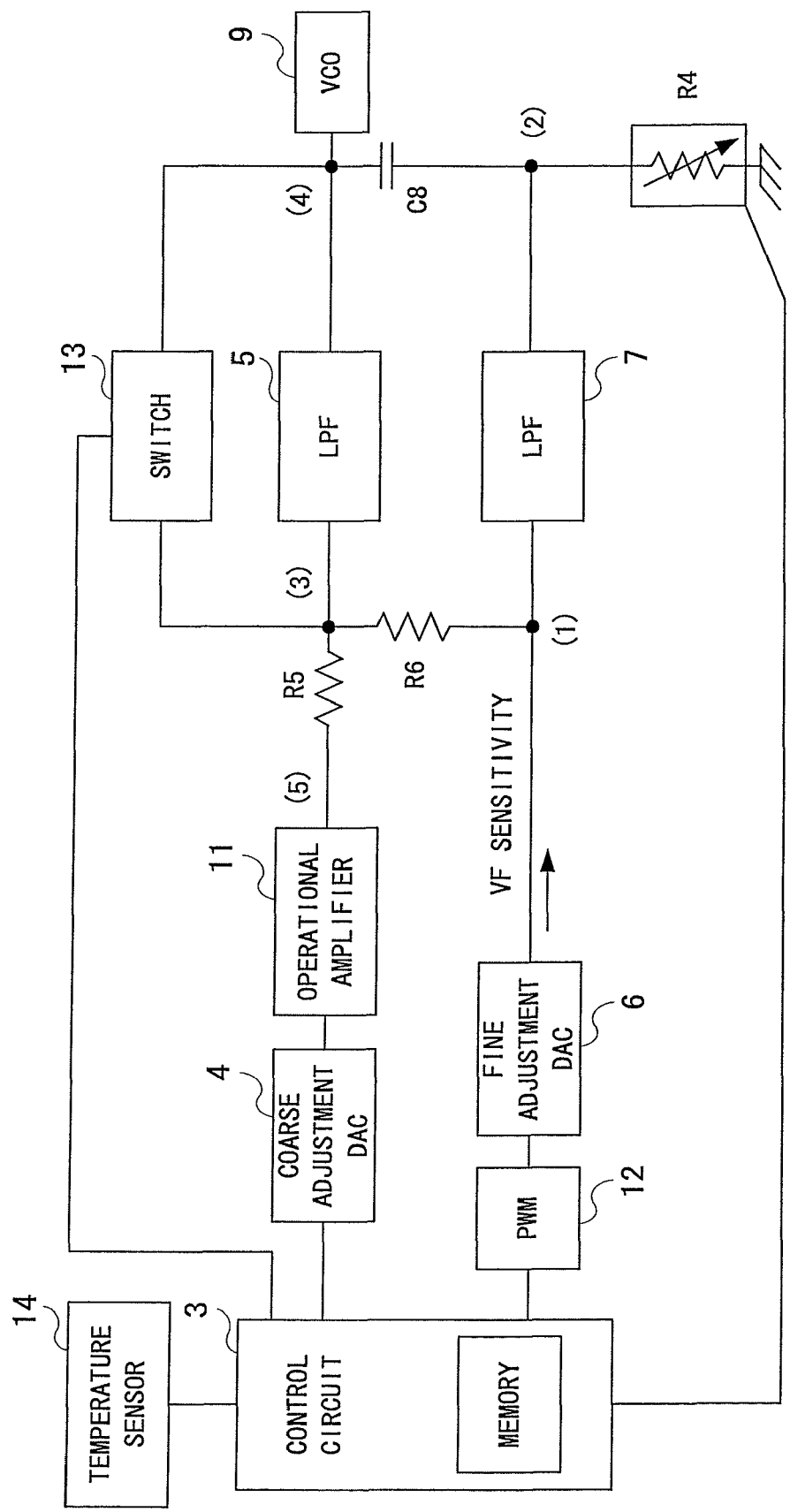
FIG. 21 is a configuration diagram of an eighth VCO driving circuit according to an embodiment of the present invention.

[Eighth VCO Driving Circuit: FIG. 21]

Next, an eighth VCO driving circuit (eighth VCO driving circuit) according to the embodiment of the present invention will be described with reference to FIG. 21. FIG. 21 shows a configuration diagram of the eighth VCO driving circuit according to the embodiment of the present invention.

The eighth VCO driving circuit, as shown in FIG. 21, is the same as the sixth VCO driving circuit, except that the eighth VCO driving circuit is further provided with a switch 13 that connects the node (3) between the resistor R5 and the LPF 5 and the node (4) between the LPF 5 and the VCO 9 to each other. The switch 13 is open or closed by the control of the control circuit 3.

The operation of the switch 13 is the same as that described in relation to the third VCO driving circuit.

Figure 22:
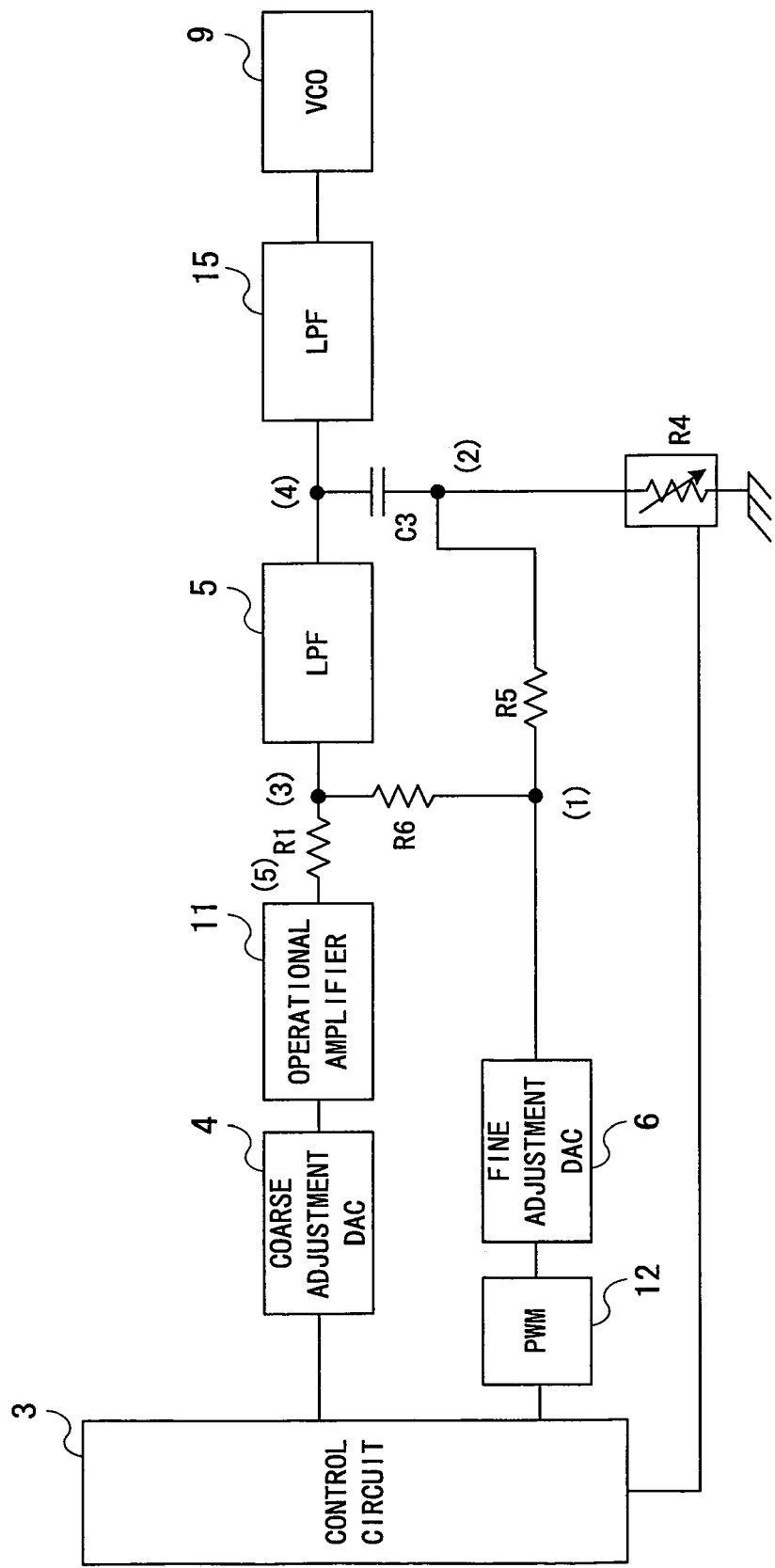
FIG. 22 is a configuration diagram of a ninth VCO driving circuit according to an embodiment of the present invention.

[Ninth VCO Driving Circuit: FIG. 22]

Next, a ninth VCO driving circuit (ninth VCO driving circuit) according to the embodiment of the present invention will be described with reference to FIG. 22. FIG. 22 shows a configuration diagram of the ninth VCO driving circuit according to the embodiment of the present invention.

In the ninth VCO driving circuit, as shown in FIG. 22, the output of the control circuit 3 is input to the control terminal of the VCO 9 via the coarse adjustment line to which the coarse adjustment DAC 4, the operational amplifier 11, a resistor R1, the LPF 5, and an LPF 15 are connected in series.

One end of a capacitor C3 is connected between the LPF 5 and the LPF 15, and the other end thereof is connected to the ground via a variable resistor R4.

The LPF may be an RC filter formed by a combination of a resistor R and a capacitor C, an LC filter formed by a combination of an inductor L and a capacitor C, or a filter formed by a combination of a resistor R, an inductor L, and a capacitor C.

Meanwhile, the output from the control circuit 3 is connected to the fine adjustment line to which the PWM 12, the fine adjustment DAC 6, the resistors R5, and the variable resistor R4 are connected in series, and the terminal end of the variable resistor R4 is connected to the ground.

A node (3) between the resistor R1 and the LPF 5 of the coarse adjustment line and a node (1) between the fine adjustment DAC 6 and the resistor R5 of the fine adjustment line are connected to each other via the resistor R6.

Moreover, a node (4) between the LPF 5 and the LPF 15 of the coarse adjustment line and a node (2) between the resistor R5 and the variable resistor R4 of the fine adjustment line are capacitively coupled to each other via a capacitor C3.

The ninth VCO driving circuit has a configuration of a type wherein the output from the fine adjustment DAC 6 is a voltage. That is, the coarse adjustment line is driven by a voltage, and the fine adjustment line is also driven by a voltage. A basic operation principle is the same as that of the fifth VCO driving circuit of the current output type.

In the ninth VCO driving circuit, the output of the coarse adjustment DAC 4 determines a rough VCO output frequency, and the PWM signal of the output of the fine adjustment DAC 6 controls the PLL.

The PWM signal of the output of the fine adjustment DAC 6 is added at the capacitor C3 to the output of the coarse adjustment DAC 4.

To prevent a DC component (1) of the fine adjustment DAC 6 of the fine adjustment line from having influence on a DC component (4) of the coarse adjustment line, the resistor R6 is connected between them. In particular, when the resistance of the resistor R6 is designed sufficiently larger than the total resistance of the resistor R5 and the variable resistor R4, the influence can be decreased.

Here, the LPF 15 is configured as an LPF (third LPF) that smoothes out the PWM signal.

Moreover, the resistor R1 and the LPF 5 are configured as an LPF having a large time constant that removes noise from the output of the coarse adjustment DAC 4.

Figure 23:
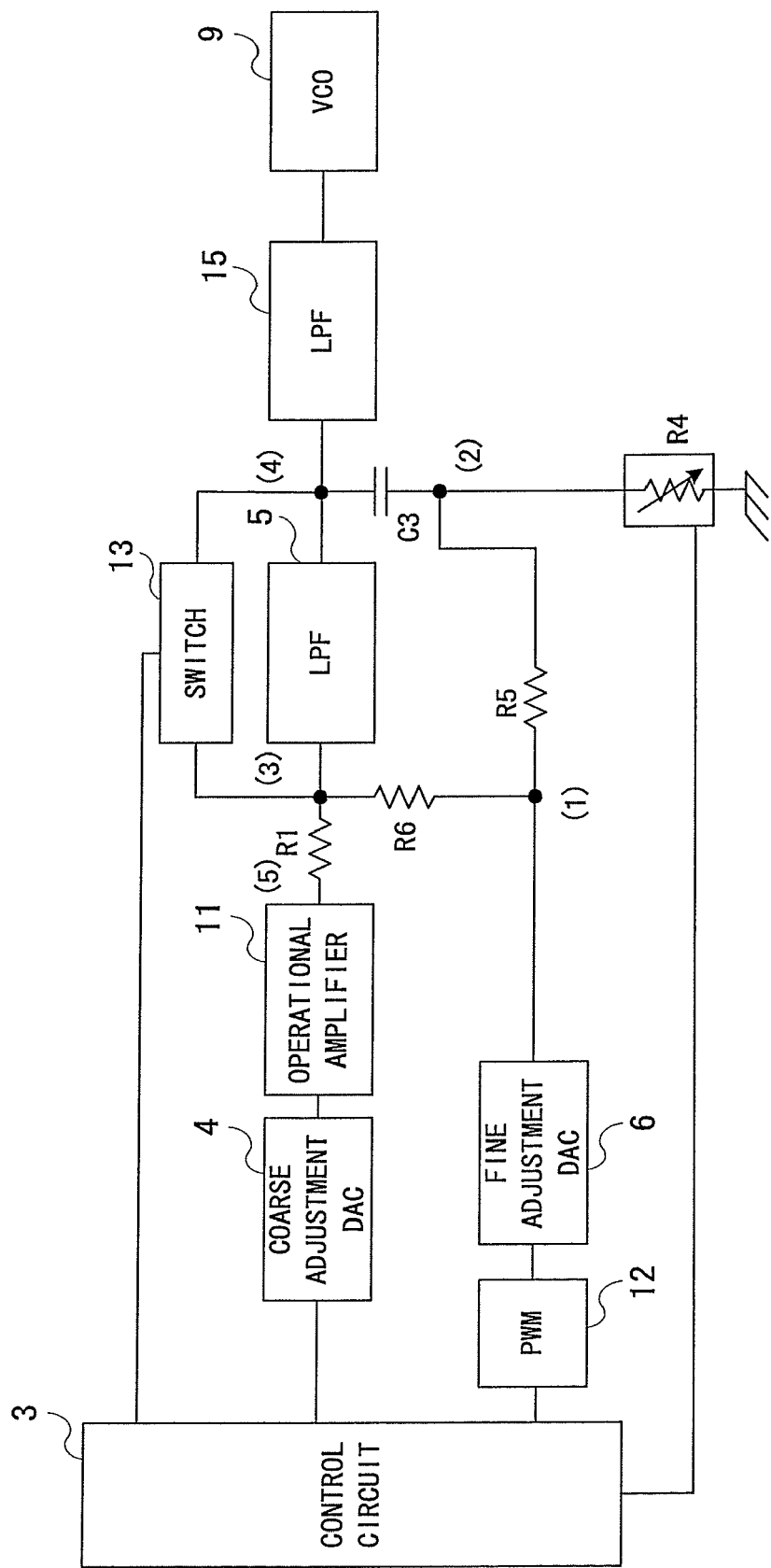
FIG. 23 is a configuration diagram of a tenth VCO driving circuit according to an embodiment of the present invention.

[Tenth VCO Driving Circuit: FIG. 23]

Next, a tenth VCO driving circuit (tenth VCO driving circuit) according to the embodiment of the present invention will be described with reference to FIG. 23. FIG. 23 shows a configuration diagram of the tenth VCO driving circuit according to the embodiment of the present invention.

The tenth VCO driving circuit, as shown in FIG. 23, is the same as the ninth VCO driving circuit, except that the tenth VCO driving circuit is further provided with a switch 13 that connects the node (3) between the resistor R1 and the LPF 5 and the node (4) between the LPF 5 and the LPF 15 to each other. The switch 13 is open or closed by the control of the control circuit 3.

The operation of the switch 13 is the same as that described in relation to the third VCO driving circuit.

Figure 24:
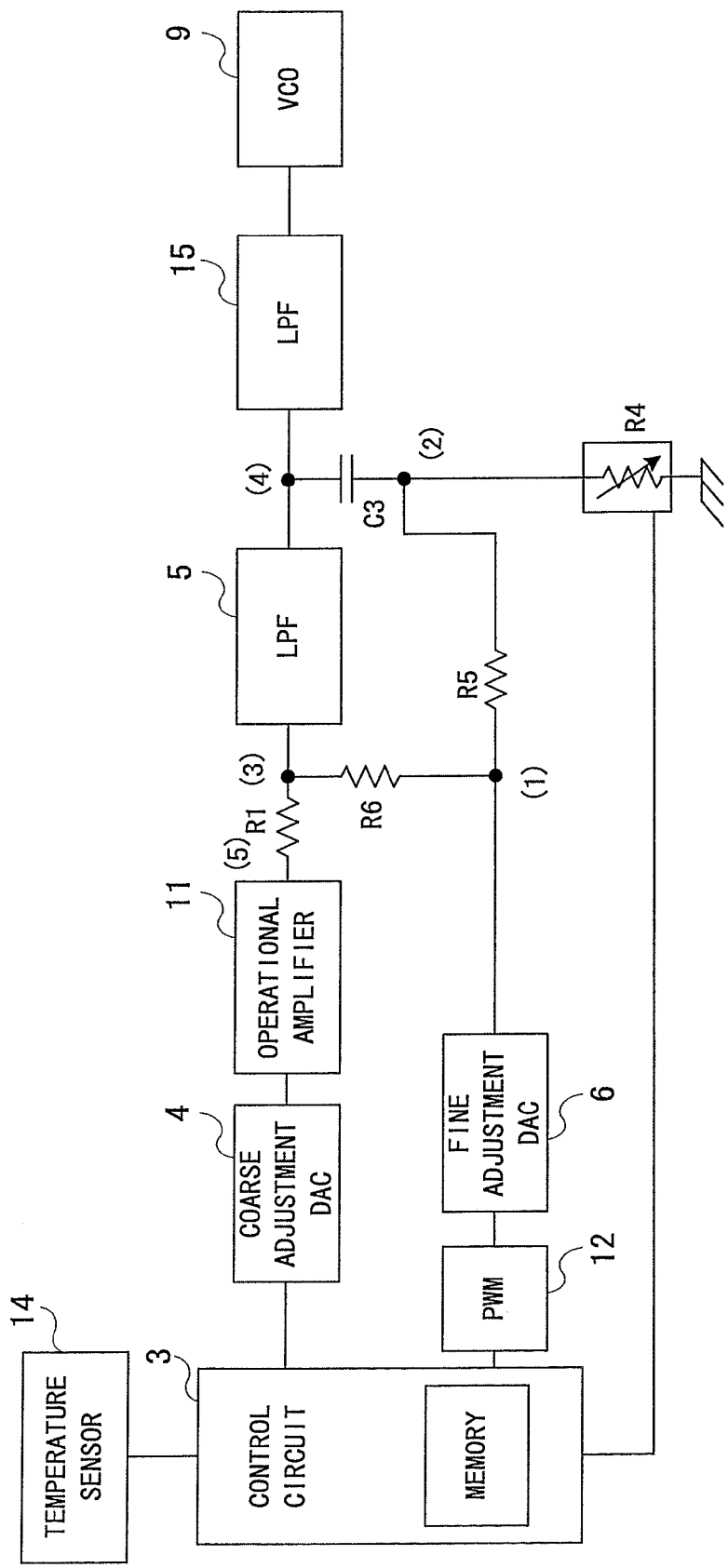
FIG. 24 is a configuration diagram of an eleventh VCO driving circuit according to an embodiment of the present invention.

[Eleventh VCO Driving Circuit: FIG. 24]

Next, an eleventh VCO driving circuit (eleventh VCO driving circuit) according to the embodiment of the present invention will be described with reference to FIG. 24. FIG. 24 shows a configuration diagram of the eleventh VCO driving circuit according to the embodiment of the present invention.

The eleventh VCO driving circuit, as shown in FIG. 24, is the same as the ninth VCO driving circuit, except that similar to the sixth VCO driving circuit, the eleventh VCO driving circuit is provided with a temperature sensor 14 that is connected to the control circuit 3, and the control circuit 3 is provided with a memory that stores as data, the relationship between the VF sensitivity relative to temperature and corresponding suitable R4 resistance. Then, the control circuit 3 searches the memory based on the temperature detected by the temperature sensor 14 to thereby read in a corresponding suitable resistance so that the VF sensitivity as viewed from the fine adjustment DAC 6 reaches a target VF sensitivity, and sets the resistance (control value) of the variable resistor R4.

Figure 25:
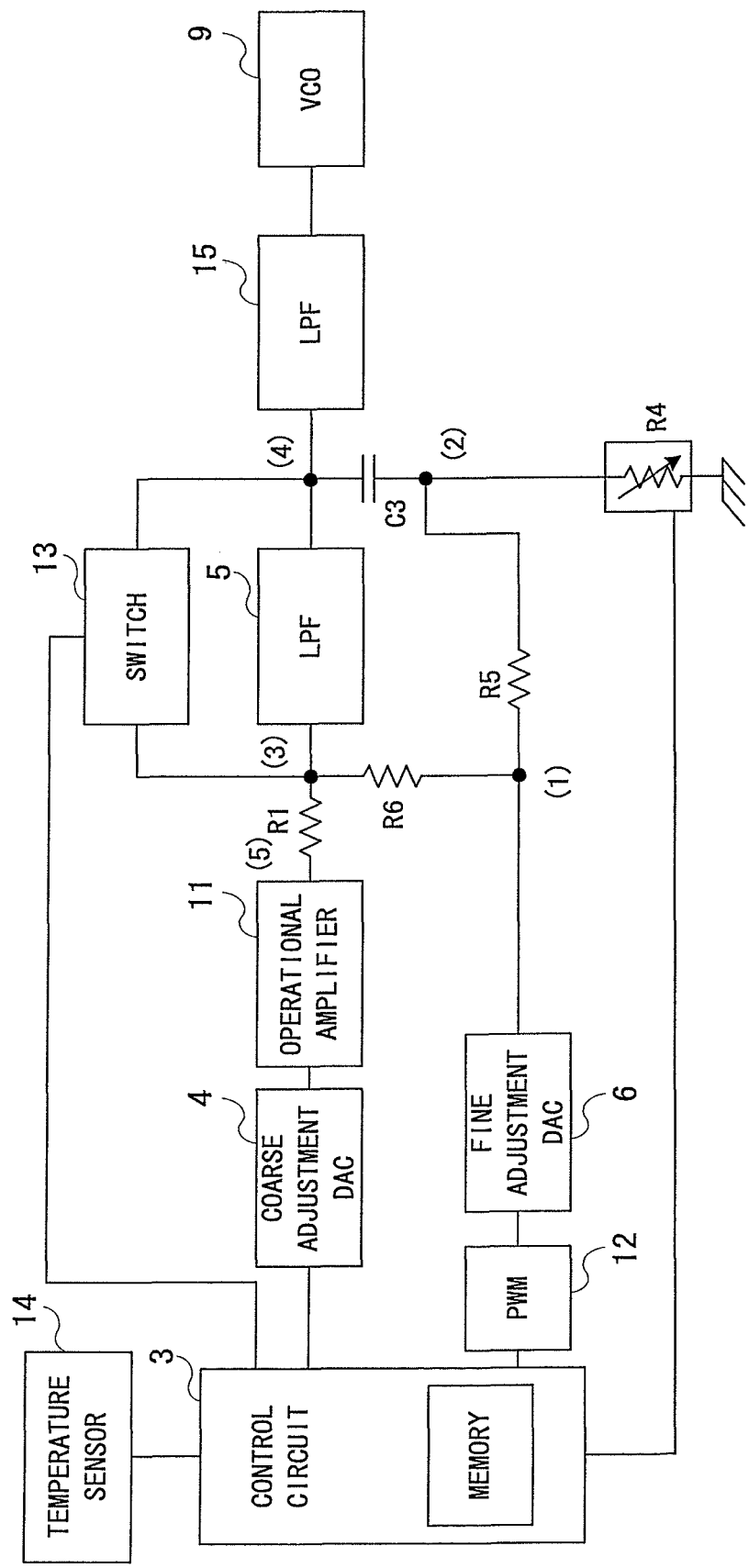
FIG. 25 is a configuration diagram of a twelfth VCO driving circuit according to an embodiment of the present invention.
Figure 26:
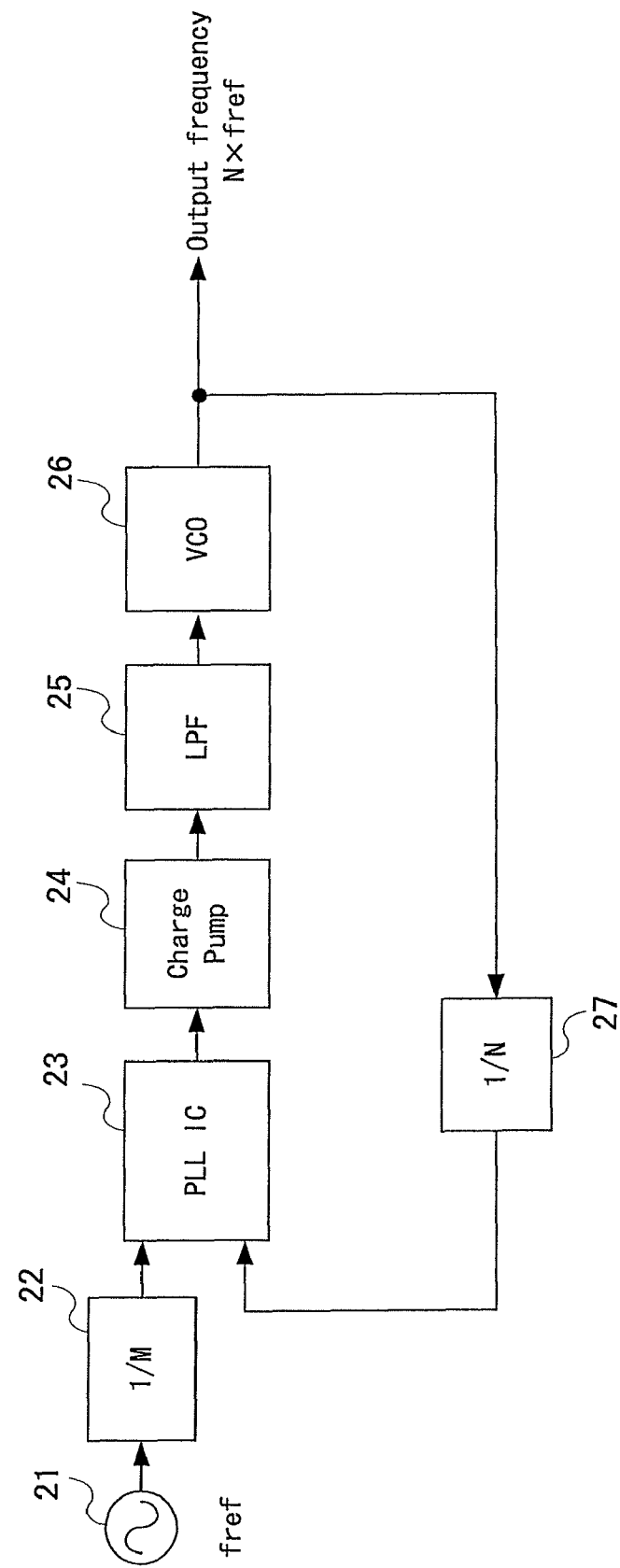
FIG. 26 is a schematic configuration diagram of a conventional frequency synthesizer.
Figure 27:
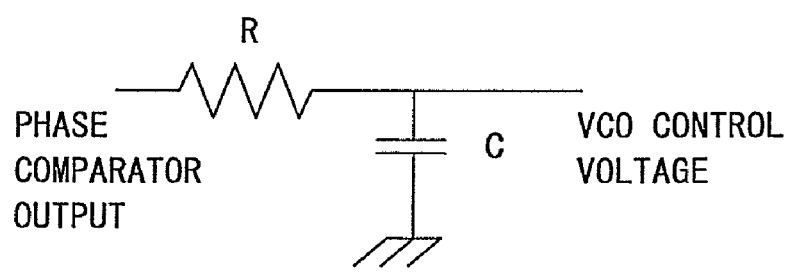
FIG. 27 is a configuration diagram of a lag filter.
Figure 28:
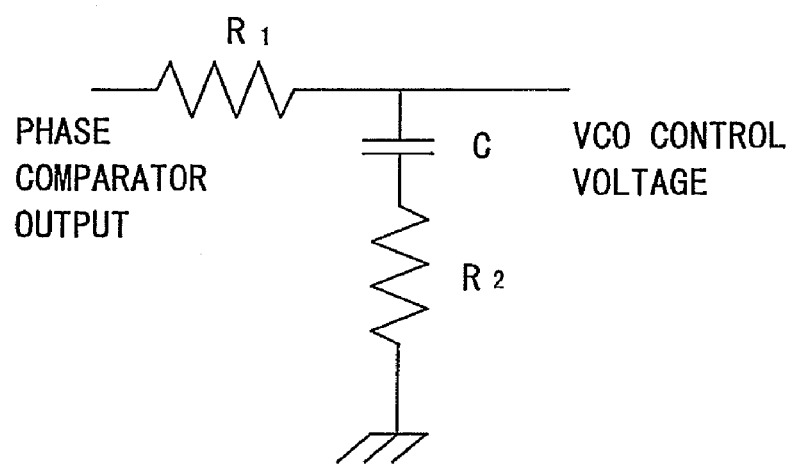
FIG. 28 is a configuration diagram of a lag-lead filter.
Figure 29:
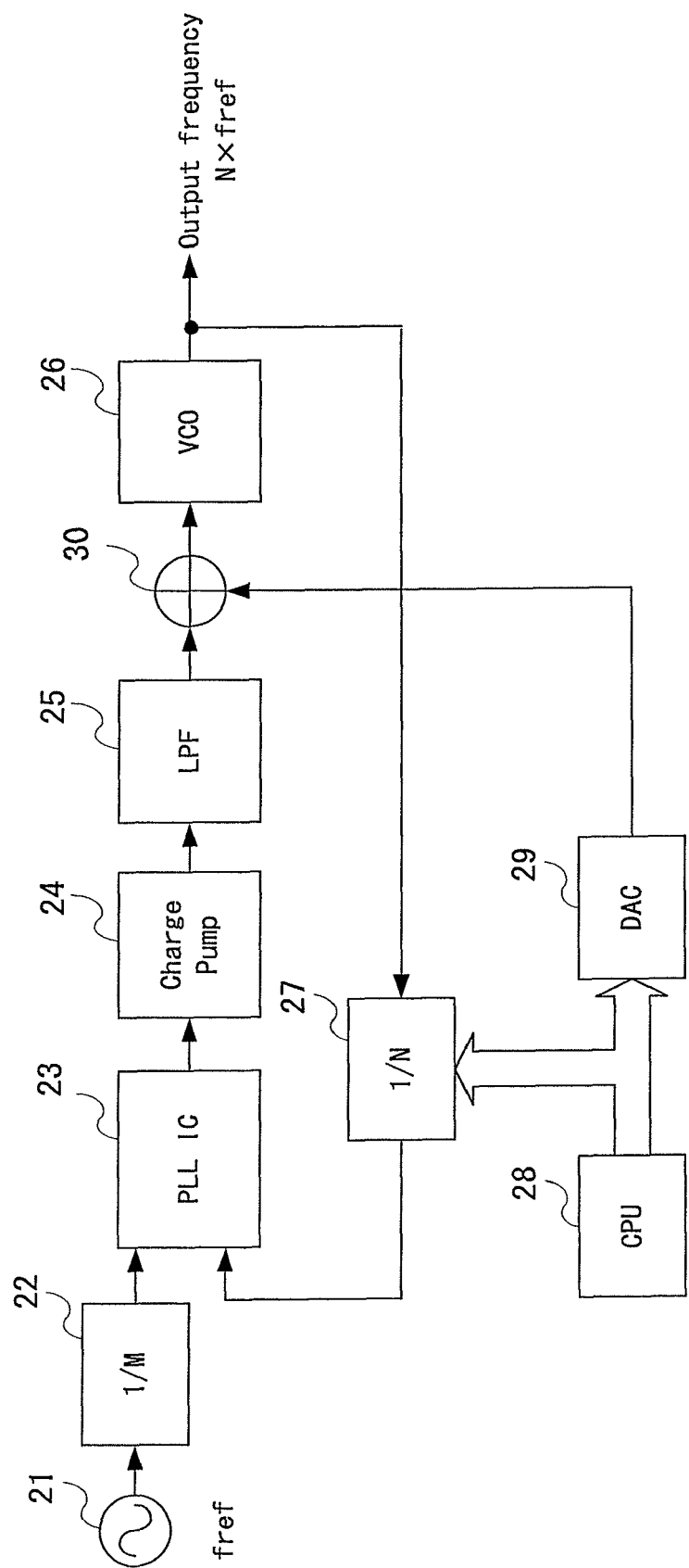
FIG. 29 is a schematic configuration diagram of another conventional frequency synthesizer.

[Twelfth VCO Driving Circuit: FIG. 25]

Next, a twelfth VCO driving circuit (twelfth VCO driving circuit) according to the embodiment of the present invention will be described with reference to FIG. 25. FIG. 25 shows a configuration diagram of the twelfth VCO driving circuit according to the embodiment of the present invention.

The twelfth VCO driving circuit, as shown in FIG. 25, is the same as the tenth VCO driving circuit, except that similar to the sixth and eleventh VCO driving circuits, the twelfth VCO driving circuit is provided with a temperature sensor 14 that is connected to the control circuit 3, and the control circuit 3 is provided with a memory that stores as data, the relationship between the VF sensitivity relative to temperature and corresponding suitable R4 resistance. Then, the control circuit 3 searches the memory based on the temperature detected by the temperature sensor 14 to thereby read in a corresponding suitable resistance so that the VF sensitivity reaches a target VF sensitivity, and sets the resistance (control value) of the variable resistor R4.

The present invention is suitable for a VCO driving circuit and a frequency synthesizer capable of reducing the impedance as viewed from a VCO control terminal to thereby prevent degradation of the VCO phase noise characteristics.

What is claimed is:

1. A VCO driving circuit that inputs a control signal to a control terminal of a voltage controlled oscillator, the VCO driving circuit comprising:
   a coarse adjustment DAC that receives digital data having a coarse adjustment frequency to output an analog signal;
   a fine adjustment DAC that receives digital data having a fine adjustment frequency to output an analog signal;
   a first LPF that removes noise from an output signal from the coarse adjustment DAC, the first LPF having frequency pass characteristics that allow only a low frequency component to pass therethrough;

a voltage dividing means that divides a voltage of an output from the fine adjustment DAC;

a resistor that connects an input stage of the first LPF to an input stage of the voltage dividing means;

a third LPF that smoothes out an output signal from the first LPF and then provides the resulting signal as an input to the control terminal of the voltage controlled oscillator; and a capacitor that provides a capacitive coupling such that the voltage divided by the voltage dividing means is applied to the output of the first LPF.

2. The VCO driving circuit according to claim 1,
wherein the first LPF is configured by a combination of a resistor and a capacitor, a combination of an inductor and a capacitor or a resistor, or a combination of an inductor and a capacitor, wherein the third LPF is configured by a combination of a resistor and a capacitor, a combination of an inductor and a capacitor or a resistor, or a combination of an inductor and a capacitor, wherein the voltage dividing means is configured by a plurality of resistors, and wherein a resistance of the resistor connecting the input stage of the first LPF to the input stage of the voltage dividing means is larger than a total resistance of the resistors of the voltage dividing means.

3. A VCO driving circuit that inputs a control signal to a control terminal of a voltage controlled oscillator, the VCO driving circuit comprising:

a control circuit that outputs digital data having a coarse adjustment frequency and digital data having a fine adjustment frequency;

a coarse adjustment DAC that receives the digital data having the coarse adjustment frequency to output an analog signal;

a fine adjustment DAC that receives the digital data having the fine adjustment frequency to output an analog signal;

a first LPF that removes noise from an output signal from the coarse adjustment DAC, the first LPF having frequency pass characteristics that allow only a low frequency component to pass therethrough;

a voltage dividing means that divides a voltage of an output from the fine adjustment DAC;

a resistor that connects an input stage of the first LPF to an input stage of the voltage dividing means;

a third LPF that smoothes out an output signal from the first LPF and then provides the resulting signal as an input to the control terminal of the voltage controlled oscillator;

a capacitor that provides a capacitive coupling such that the voltage divided by the voltage dividing means is applied to the output of the first LPF; and a voltage control means that is provided to the voltage dividing means so as to vary the voltage.

4. The VCO driving circuit according to claim 3,
wherein the first LPF is configured by a combination of a resistor and a capacitor, a combination of an inductor and a capacitor or a resistor, or a combination of an inductor and a capacitor, wherein the third LPF is configured by a combination of a resistor and a capacitor, a combination of an inductor and a capacitor or a resistor, or a combination of an inductor and a capacitor, wherein the voltage dividing means is configured by a combination of a resistor and a variable resistor, and wherein a resistance of the resistor connecting the input stage of the first LPF to the input stage of the voltage dividing means is larger than a total resistance of the resistors of the voltage dividing means.

* * * * *